(12) United States Patent
Bryant-Rich

(10) Patent No.: US 7,944,744 B2
(45) Date of Patent: May 17, 2011

(54) ESTIMATING VALUES RELATED TO DISCHARGE OF CHARGE-STORING MEMORY CELLS

(75) Inventor: Donald Ray Bryant-Rich, Haifa (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 12/495,404

(22) Filed: Jun. 30, 2009

(65) Prior Publication Data

US 2010/0329034 A1    Dec. 30, 2010

(51) Int. Cl.
*G11C 11/34* (2006.01)

(52) U.S. Cl. ......... 365/185.03; 365/185.09; 365/185.11; 365/185.18; 365/185.21; 365/185.24; 365/185.25; 365/185.33

(58) Field of Classification Search ............. 365/185.03, 365/185.09, 185.11, 185.18, 185.21, 185.24, 365/185.25, 185.33
See application file for complete search history.

(56) References Cited

U.S. PATENT DOCUMENTS

| | | | |
|---|---|---|---|
| 5,740,109 A * | 4/1998 | Morton et al. ........... | 365/185.18 |
| 5,818,762 A | 10/1998 | Maari et al. | |
| 5,877,983 A * | 3/1999 | Tempel .................... | 365/185.18 |
| 5,998,831 A * | 12/1999 | Kodama et al. .......... | 365/185.24 |
| 6,055,189 A * | 4/2000 | Ogane ..................... | 365/185.11 |
| 6,816,409 B2 * | 11/2004 | Tanaka .................... | 365/185.03 |
| 6,826,128 B1 | 11/2004 | Berstis et al. | |
| 6,829,200 B1 | 12/2004 | Berstis et al. | |
| 6,831,879 B1 | 12/2004 | Berstis et al. | |
| 6,856,581 B1 | 2/2005 | Berstis et al. | |
| 6,885,590 B1 * | 4/2005 | Zheng et al. ............. | 365/185.18 |
| 6,898,123 B2 * | 5/2005 | Owen ...................... | 365/185.21 |
| 7,002,845 B2 * | 2/2006 | Nakamura et al. ........ | 365/185.11 |
| 7,048,195 B2 | 5/2006 | Berstis | |
| 7,280,407 B2 * | 10/2007 | Umezawa et al. ........ | 365/189.11 |
| 7,489,557 B2 * | 2/2009 | Kim et al. ................ | 365/185.18 |
| 7,512,007 B2 * | 3/2009 | Terasawa et al. ........ | 365/185.18 |
| 7,649,776 B2 * | 1/2010 | Abiko et al. ............. | 365/185.03 |
| 7,755,946 B2 * | 7/2010 | Dunga et al. ............. | 365/185.03 |

OTHER PUBLICATIONS

Belgal, Hanmant P. et al. "A New Reliability Model for Post-Cycling Charge Retention of Flash Memories," 40th Annual International Reliability Physics Symposium, Dallas, Texas, 2002, IEEE 02CH37320, pp. 7-20.

* cited by examiner

*Primary Examiner* — Trong Phan
(74) *Attorney, Agent, or Firm* — Toler Law Group

(57) ABSTRACT

One or more groups of charge-storing memory cells are selected from a plurality of regular charge-storing memory cells of a storage device. The selected memory cells are initialized with initial binary data, by charging them with corresponding amounts of electric charge, or the selected memory cells are simply used as is containing user data. Then, while the selected memory cells undergo a self discharge process, collective changes in the binary states of the selected memory cells are used to estimate discharge-determining conditions such as elapsed time, wear rate or wear level of the memory cells. The adverse effects of the erratic behavior of individual charge-storing memory cells on such estimations is mitigated by using a large group of charge-storing memory cells, and the effect of temperature on the aforesaid estimations is reduced by using two or more large groups of charge-storing memory cells.

34 Claims, 20 Drawing Sheets

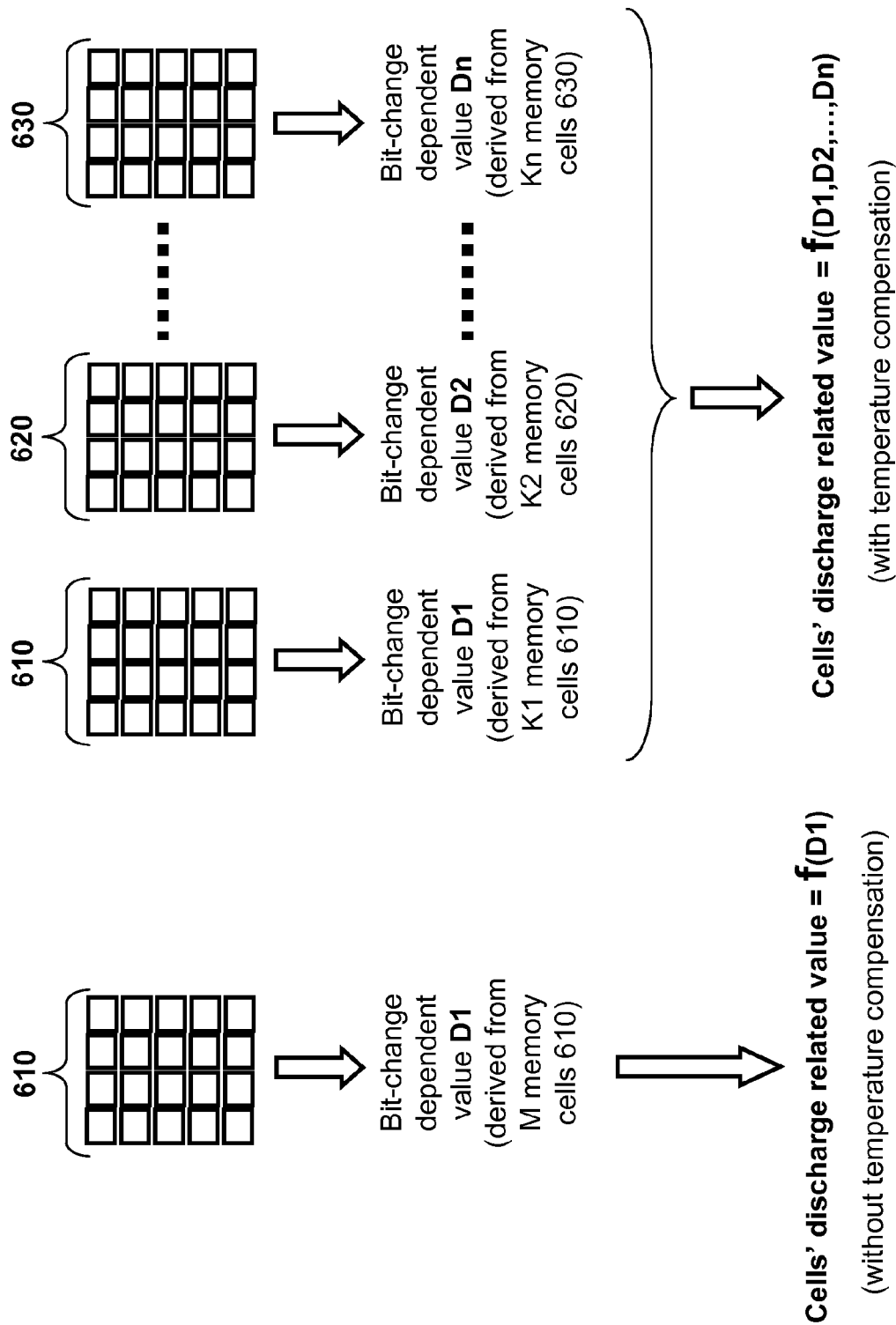

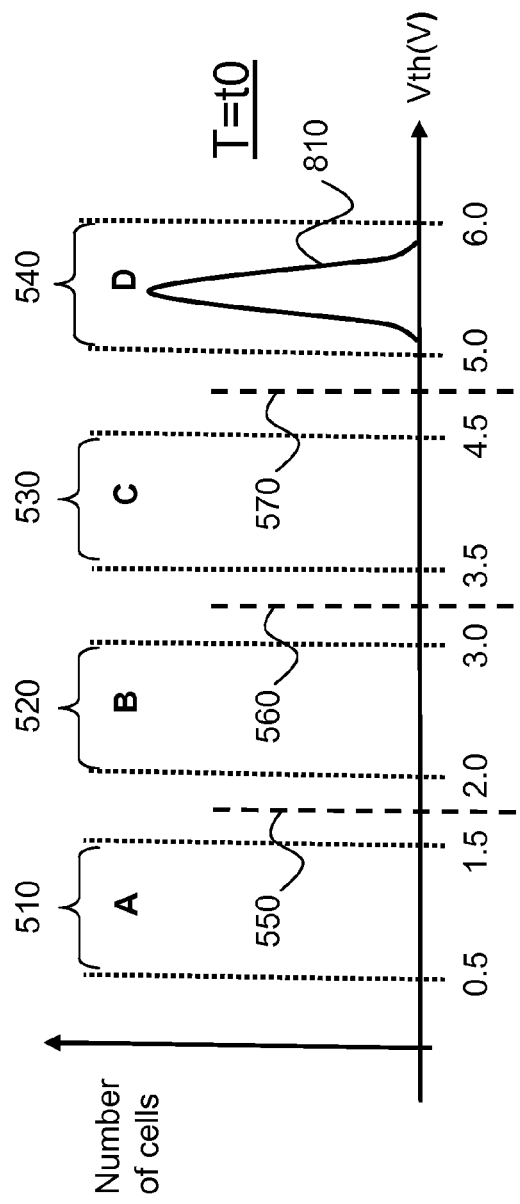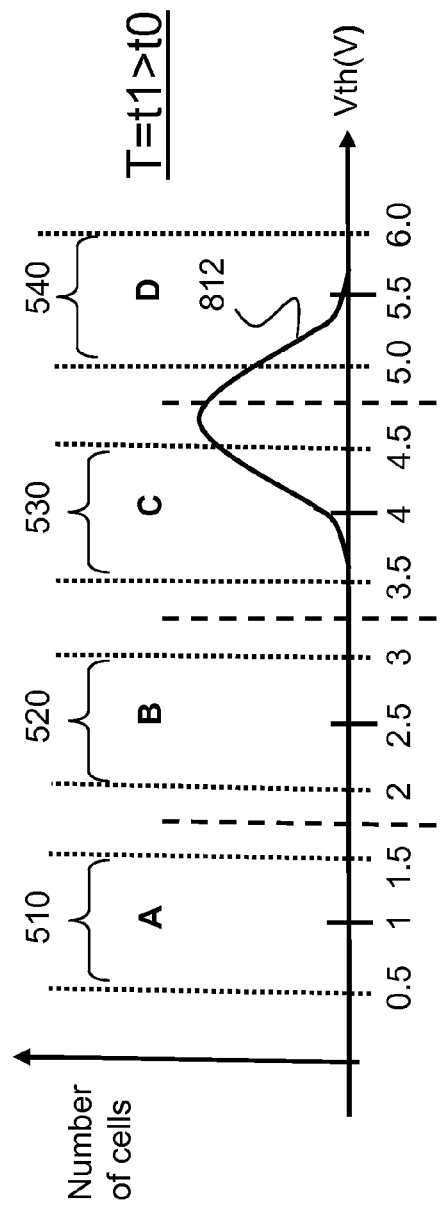

ESTIMATING VALUES RELATED TO DISCHARGE OF CHARGE-STORING MEMORY CELLS

FIELD OF THE INVENTION

The present invention generally relates to storage devices and more specifically to mechanisms for estimating values related to discharge of charge-storing memory cells of a storage device, such as elapsed time, wear level and cumulative temperature effect on time and wear estimations.

BACKGROUND

Timekeeping circuits are widely used for various purposes, for example to enforce Digital Rights Management ("DRM") policies and, in general, to check whether or not a preset time period, which may be associated with various types of time-dependent services, has expired. Some timekeeping circuits continuously require a power source (e.g., a battery) to operate. Other timekeeping circuits utilize charge-retaining devices to estimate elapsed times. A charge-retaining device, such as a capacitor, storing an initial amount of electric charge is permitted to self-discharge, over time, in some generally known manner. The amount of time that has elapsed from the time at which the initial amount of electric charge was stored in the charge-retaining device until a given later time can be found by estimating the amount of electric charge remaining in the device at the given later time.

Conventionally, dedicated charge-storing memory cells have been used to measure elapsed time. "Regular" memory cells, i.e., charge-storing memory cells used to store user data and other types of data, such as instruction codes, authentication information, and the like have not conventionally been used for measuring elapsed times because of their erratic charge-retention behavior. That is, the charge-retention behavior of any individual regular memory cell is erratic because the number of electrons that can usually be stored in a floating gate of a memory cell is small, because of the small size of the cell, which is on the order of nanometers. This means that even a relatively small number of electrons that leak from the floating gate can cause a significant change in the threshold voltage of the memory cell and, therefore, in the binary state (bit value(s)) of the memory cell. Thus, electron leakage from a memory cell can result in loss of the data stored therein (i.e. change in the data value represented by the change in the charge of the memory cell). A "regular" memory cell is also "regular" in the sense that it is fabricated on a common substrate together with other like cells (i.e., the regular cell is not fabricated, or otherwise managed or handled, as a stand-alone cell).

Various factors affect the number of electrons that leak from the floating gate and the rate at which they leak, among which factors temperature is dominant: the higher the temperature of a memory cell, the faster it loses electric charge. However, the temperature effect on electron leakage is reversible. That is, exposing a memory cell to a high temperature (e.g., 45° C.) causes the memory cell to lose electrons at a relatively high rate, but if normal temperatures (e.g., between 20° C. and 25° C.) are resumed, a lower/normal electron leakage rate is resumed as well. Such changes in the electron leakage rate make it difficult to determine to what extent a change in the amount of charge stored in a memory cell is caused by excessive temperature and to what extent the change is merely natural self-discharge due to passage of time.

Another factor inducing discharge of charge-storing memory cells is that the greater the number of write/erase cycles applied to the cells, the more the cells wear or "age". A worn memory cell can retain an electric charge for a shorter time than can a fresh memory cell or a less worn memory cell. Unlike the case of temperature effects discussed above, wear of a memory cell is irreversible. Therefore, if a memory cell is reused as a timekeeping device (i.e., by reprogramming it with new initial data), the time estimation process has to be adjusted according to the wear or age of the memory cell. However, it cannot be determined whether given charge-storing memory cells have worn "normally"; i.e., as expected (i.e., given normal operating conditions) or faster than expected.

Factors such as the above (temperature and wear), which increase the discharge rate of memory cells beyond their natural self-discharge rate, render it difficult to use the cells' natural self-discharging property to measure time or other discharge-dependent properties.

Some solutions to the problems described above involve using a timekeeping memory cell that is specially designed in a manner to have less erratic behavior than regular memory cells. However, timekeeping memory cells that are specially designed for time calculations have several drawbacks. For example, they are not used for storing regular data: regular data continues to be stored in separate memory cells. Thus, the storage device would require extra dedicated memory cells for the timekeeping task. Another drawback of such dedicated timekeeping memory cells is that they have to be handled separately, and a decision needs to be made as to where in the storage device the specially designed timekeeping memory cells should reside and how to wire them to the other components of the storage device. In other words, using a timekeeping memory cell that is specially designed for time calculations requires modifications in standard procedures related to circuit layout design, testing, and manufacturing.

SUMMARY

It would be beneficial to use regular charge-storing memory cells (e.g., flash memory cells) to measure or estimate time and other cell-discharge dependent values (e.g., wear level) by being able to compensate for the erratic behavior of individual memory cells and for temperature effects. It would also be beneficial to use regular charge-storing memory cells to determine whether the memory cells wear faster than expected. Examples of various embodiments implementing such time and other measurements by use of regular flash memory cells are provided herein.

According to an example embodiment, one or more groups of charge-storing memory cells are selected from a plurality of regular charge-storing memory cells of a storage device. The selected memory cells are initially programmed to a particular one of N (N≧2) binary states by storing therein an amount of electric charge proportional to a voltage higher than a threshold voltage corresponding to the particular binary state. (The term "binary state" refers to the fact that the state corresponds to the value(s) of the bit(s) (binary digit(s)) of the memory cell. For example, a single bit cell may have a binary state of 0 or 1, a two-bit cell may have a binary state of 00, 01, 10 or 11, and so on.) Thereafter, changes in the binary states of the memory cells of the one or more groups of charge-storing memory cells, which are caused by a self-discharge process, collectively serve to estimate elapsed time, wear level of the memory cells, or other values that are a function of the cells' natural self-discharge rate (these quantities that are a function of the cells' natural self-discharge rate are referred to herein as "discharge-determining conditions").

The erratic behavior of individual charge-storing memory cells on estimations of elapsed time, etc. is mitigated by using a large group of charge-storing memory cells, and the effect of temperature on such estimations is reduced by using two or more large groups of charge-storing memory cells.

BRIEF DESCRIPTION OF THE DRAWINGS

Various exemplary embodiments are illustrated in the accompanying figures with the intent that these examples not be restrictive. It will be appreciated that, for simplicity and clarity of the illustration, elements shown in the figures referenced below are not necessarily drawn to scale. Also, where considered appropriate, reference numerals may be repeated among the figures to indicate like, corresponding or analogous elements. Of the accompanying figures:

FIG. 6A schematically illustrates usage of one group of memory cells to estimate discharge dependent values of the cells according to an example embodiment;

FIG. 6B schematically illustrates usage of n (n>1) groups of memory cells to estimate discharge dependent values of the cells according to an example embodiment;

FIGS. 8A through 8D show the effect of time on the binary states of a group of "2 bit-per-cell" charge-storing memory cells;

DETAILED DESCRIPTION

Figure 1:
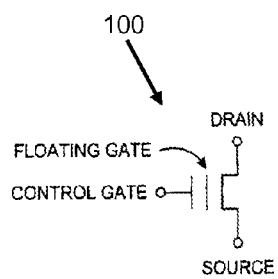
FIG. 1 (prior art) shows a schematic representation of a typical charge-storing memory cell.

The description that follows provides various details of exemplary embodiments. However, this description is not intended to limit the scope of the claims but instead to explain various principles of the invention and the manner of practicing it.

Charge-storing memory cells with floating gates store data by retaining electrons (electric charge) in their floating gates. A given state of the floating gate, i.e. a given number of electrons (a given amount of electric charge) stored in the floating gate, corresponds to or represents a given data value (e.g. a "0" or a "1," or an "on" or "off" state). In such a charge-retaining memory device, such as an EEPROM or a flash EEPROM, which has floating gates and to which data can be electrically rewritten, it is possible to controllably change the amount of electric charge stored in the memory cells, and thereby change the data stored therein, by injecting and releasing electrons to and from the floating gates. Assuming the electric charge accumulated in a floating gate of a charge-storing memory cell is not refreshed or intentionally changed, the floating gate naturally loses electrons with the passage of time, which phenomenon results in a change in the amount of electric charge stored in the memory cells. The (change in the) amount of electric charge in a floating gate can be measured by measuring the threshold voltage of the floating gate. (The threshold voltage of the floating gate is the voltage applied to the control gate terminal of the floating gate, which is sufficient to cause a current to flow from the drain to the source of the floating gate.)

According to "*A New Reliability Model for Post-Cycling Charge Retention of Flash Memories*" (Hanmant P. Belgal et al., IEEE 40th Annual International Reliability Physics Symposium, Dallas, Tex., 2002, page 9), which is incorporated herein by reference, the threshold voltage of a charge-storing memory cell and time are related as shown in equation (1):

$$V_{tadj.} = \left(\frac{-1}{b}\right)\ln[t] + \left(\frac{-1}{b}\right)\ln[I_o] + \left(\frac{-1}{b}\right)\ln\left[\frac{b}{C_{tot}a_g}\right] + V_{tna} \quad (1)$$

where $V_{tadj}$ is an adjusted threshold voltage of a charge-storing memory cell, b is a constant, t is a bake time of the charge-storing memory cell, $I_0$ is a constant, $C_{tot}$ is the total capacitance of the floating gate of the charge-storing memory cell, $a_g$ is a control gate coupling ratio, and $V_{tna}$ is a native threshold voltage of the charge-storing memory cell.

The formula for calculating elapsed time from a threshold voltage depends on the type of charge-storing memory cell and how the charge-storing memory cell is used. The more general relationship between time and the threshold voltage, which is derived from equation (1), is as shown in equation (2):

$$\ln [t] \cong b(V_{tna} - V_{tadj}) - f(I_o, C_{tot}, a_g) \quad (2)$$

where the variables are the same as identified in connection with equation (1) above.

As stated above, a charged memory cell naturally self-discharges over time. This implies that no power is required to control the electron self-discharge process. Therefore, efforts have been made to use the $V_t$-vs.-time characteristics of memory cells to calculate elapsed times, but, as explained above, using $V_t$-vs.-time characteristics of memory cells to calculate elapsed times in a direct manner is problematic, especially if regular memory cells are used. However, using binary states of large group(s) of memory cells to estimate elapsed times eschew many of these problems. Using binary states of large group(s) of memory cells also facilitates estimation of other factors (temperature effect, wear level), as described below.

FIG. 1 is a schematic representation of a typical charge-storing memory cell 100. Charge-storing memory cell (herein referred to as a "memory cell", for short) 100 is a charge storage element implemented as a floating gate Field Effect Transistor ("FET"). The operation of floating gate FETs is well known in the art. Briefly, charge-storing memory cell 100 includes a drain ("DRAIN") a source ("SOURCE"), a floating gate ("FLOATING GATE"), and a control gate ("CONTROL GATE"). The memory cell's gate is 'floating' in the sense that it is electrically isolated from its environment (although the isolation is not perfect, as explained below). The relatively good isolation makes the transistor's gate useful for retaining electric charge.

In order to cause an electric current to flow from the drain to the source, a sufficiently high voltage has to be applied to the control gate of the memory cell. Specifically, a voltage higher than a threshold voltage of the memory cell is required to cause an electric current to flow from the drain to the source. As is known in the art, the threshold voltage of a memory cell such as memory cell 100 depends largely on the number of electrons contained in the floating gate: the greater the number of electrons contained in the floating gate of a memory cell, the higher the memory cell's threshold voltage.

Accordingly, binary data, also referred to herein as "binary state", can be written (i.e., programmed) into the memory cell by storing in the memory cell a corresponding amount of electric charge, and the binary data/state can be read from the memory cell at a later (given) point in time by determining the amount of electric charged stored therein, which in turn can be determined by detecting the memory cell's threshold voltage. Detecting a memory cell's threshold voltage is done by increasing a voltage applied to the control gate terminal up to a point where current starts to flow from the drain to the source. The amount of voltage applied at the point where current starts to flow from the drain to the source is the memory cell's threshold voltage. In this way, data can be read from a memory cell by detecting the memory cell's threshold voltage.

Figure 2A:
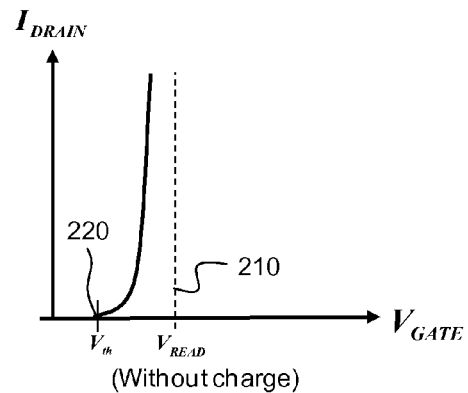
FIGS. 2A and 2B (prior art) show the effect of a programming operation on the threshold voltage of a charge-storing memory cell.
Figure 2B:
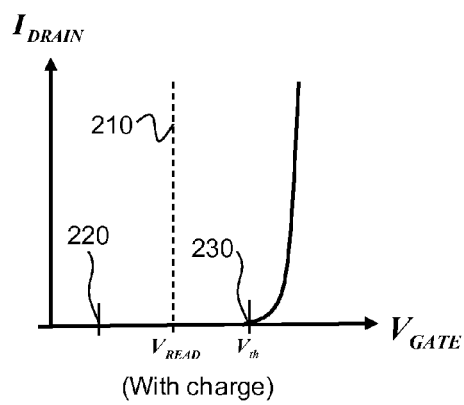

FIG. 2A and FIG. 2B respectively show exemplary "V-I" characteristics of a charge-storing memory cell, such as charge-storing memory cell 100 of FIG. 1, before and after the memory cell is programmed, and thence the effect of such programming on the memory cell's threshold voltage. Each of FIGS. 2A and 2B illustrate the V-I characteristics depicting a drain current $I_{DRAIN}$ along the y-axis and depicting a gate voltage $V_{GATE}$ along the x-axis. Reference numeral 210 (in FIG. 2A and in FIG. 2B) designates a "read reference voltage" $V_{READ}$. As a memory cell can store one of a plurality of binary states for each bit it stores, using one or more read reference voltages allows detecting the binary state of the memory cell. The number of the read reference voltages required depends on a figure known in the art as the "number of bits-per-cell". For example, if the memory cell is configured to hold, say, two bits (i.e., the cell is of a "2 bits-per-cell" type), then three read reference voltages are required to distinguish between four binary states (i.e., "00", "01", "10", and "11") that the memory cell can hold. (A cell holding two bits requires four states, since each bit can be in either of two states—each bit can hold a value of 1 or 0.)

With reference to FIG. 2A, before the floating gate of the memory cell is charged with electric charge by a programming operation (illustrated as "without charge"), the application of a voltage at the control gate that is higher than the memory cell's relatively low threshold voltage 220 permits current to flow through the drain, assuming the drain is positively biased with respect to the source. The relatively low threshold voltage 220 that the memory cell has before any electric charge is injected into it is known in the art as a "native threshold voltage". Hence, during a memory read operation to read the binary data that is stored in the memory cell (i.e., a read operation to read the binary state of the memory cell or to read a bit value of the cell; i.e., "0" or "1"), the application of a voltage at the control gate that is higher than threshold voltage 220 (e.g., the application of read reference voltage 210) causes the FET transistor to conduct current from the drain to the source, thereby providing an indication that the floating gate has not been programmed.

With reference to FIG. 2B, injecting into the floating gate an amount of electric charge by a programming operation (illustrated as "with charge"), causes the memory cell's threshold voltage to increase (i.e., it causes it to shift to the right on the abscissa (x axis)). The memory cell's increased threshold voltage is shown at 230. The application of a voltage at the control gate that is lower than the memory cell's threshold voltage 230 will not cause current to flow through the drain, assuming the drain is positively biased with respect to the source. Hence, during a memory read operation to read the binary state of the memory cell, applying read reference voltage 210 to the control gate of the memory cell does not turn on the transistor (i.e., current does not flow through the drain), thereby providing an indication that the floating gate has been programmed.

The two operational states of the floating gate (i.e., the "on" state and the "off" state) indicate a binary value "1" and a binary value "0", respectively, (or, according to an alternate convention, a "0" and a "1," respectively). Hence, when a floating gate is programmed, one can interpret the operation as setting the memory cell to a logical value "0" or according to the alternate convention a logical value of "1". By performing a read operation on the memory cell (i.e., by applying read reference voltage 210 to the cell's control gate), a binary determination can be made as to whether or not the memory cell contains/holds/stores a logical "1" or logical "0".

Figure 3:
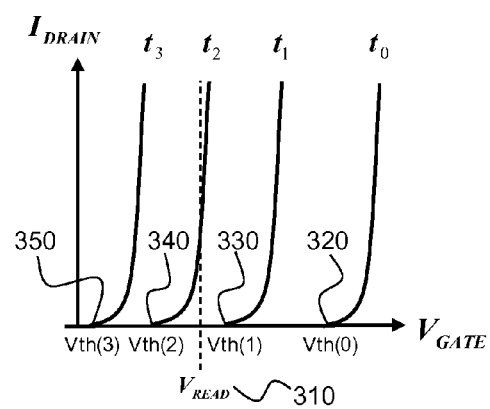
FIG. 3 depicts threshold voltage response graphs showing changes in the threshold voltage of a charge-storing memory cell as it loses electric charge.

FIG. 3 depicts threshold voltage response graphs showing changes in threshold voltage of a charge-storing memory cell, such as charge-storing memory cell 100 of FIG. 1, as it loses electric charges over time. The threshold voltage response graphs illustrate V-I characteristics depicting a drain current $I_{DRAIN}$ along the y-axis and depicting a gate voltage $V_{GATE}$ along the x-axis. As explained above, the insulation of floating gates of memory cells is not perfect. This means that floating gates lose electrons over time, by means of various mechanisms that will not be discussed herein as they are known in the art.

Assume that at time t0 the floating gate of a charge-storing memory cell receives (during a programming operation) an initial amount of electric charge corresponding to an initial high threshold voltage Vth(0) (shown at 320). Subsequent application of read reference voltage 310 (e.g., $V_{READ}$) to the cell's control gate would not cause current to flow through the drain because it is lower than Vth(0). This means that the floating gate is holding an amount of electric charge that is sufficiently large to hold the transistor in the off state during the read operation. Over time, as the floating gate loses electrons, the threshold voltage of the transistor decreases. As a result of the decreasing threshold voltage, the transistor can be turned on using lower and lower control gate voltages. For example, at time t1 (t1>t0) the threshold voltage is Vth(1) (shown at 330), where Vth(1)<Vth(0). Applying read reference voltage 310 to the cell's floating gate at time t1 still will not cause current to flow through the drain (i.e., the transistor is still in its off state) because the cell's threshold voltage Vth(1) is still higher than read reference voltage 310.

At some point in time, the floating gate will lose enough electric charge so that read reference voltage 310 will turn on the FET transistor. For example, at times t2 and t3 (t3>t2>t1) the threshold voltages are respectively Vth(2) (shown at 340) and Vth(3) (shown at 350), where Vth(3)<Vth(2)<Vth(1). Applying read reference voltage 310 to the cell's floating gate at time t2 or at time t3 will cause current to flow through the drain (i.e., the transistor will turn on) because read reference voltage 310 is higher then the cell's threshold voltages Vth(2) and Vth(3).

A floating gate generally embodies a capacitor and, as such, it loses electrons exponentially or almost exponentially (i.e., depending on the factors affecting the electrons loss: e.g., temperature, number of program/write cycles, etc.). Knowing the electron discharge function of the floating gate, i.e. the rate of electron discharge over time, performance of a read operation on the memory cell can generally be used to roughly estimate whether or not a predetermined time period has elapsed. However, as explained above, any individual charge-storing memory cell may manifest erratic discharge behavior, for which reason a single charge-storing memory cell is very unreliable as a timekeeping element. In that respect, "*A New Reliability Model for Post-Cycling Charge Retention of Flash Memories*" states (page 14, clause C. in the discussion part): "*Although specific cumulative probability points, . . . , usually have smoothly-varying Vt-vs.-time characteristics, . . . , similar data for individual cells or blocks indicate that the leakage is erratic over time, . . . ,*". A statistically sufficient number of charge-storing memory cells, on the other hand, collectively display a more stable discharge pattern, hence permitting more reliable timekeeping, as explained below.

Figure 4:
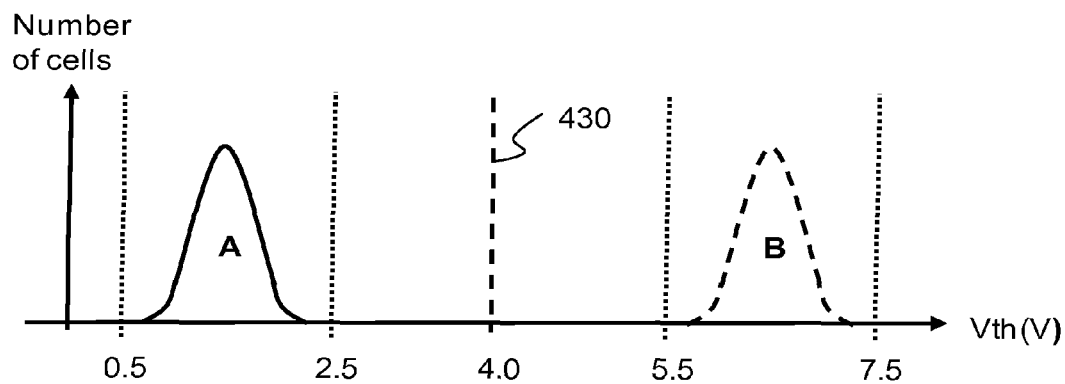
FIG. 4 (prior art) shows distributions of threshold voltages of "1 bit-per-cell" charge-storing memory cells before and after electrons are injected into their floating gates.

FIG. 4 shows distributions of threshold voltages of "1-bit-per-cell" memory cells before and after electrons are injected into their floating gates. In FIG. 4, the abscissa indicates the threshold voltage Vth and the ordinate (y axis) indicates the total number of memory cells at any given threshold voltage.

In addition, "A" indicates a distribution of threshold voltages of memory cells in which electrons have not been injected into the memory cells' floating gates, and "B" indicates a distribution of threshold voltages of memory cells in which electrons have been injected into the memory cells' floating gates. According to distribution A, memory cells into whose floating gates electrons have not been injected have threshold voltages Vth between 0.50V and 2.50V. According to distribution B, memory cells in to whose floating gates electrons have been injected have threshold voltages Vth between 5.50 V and 7.50 V. Data is read from the memory cells by applying a read reference voltage 430, which is higher than 2.50V and lower than 5.50V. By way of example, read reference voltage 430 is 4.00V.

The threshold voltage distribution curves shown in FIG. 4 pertain to memory cells of the "1 bit-per-cell" type. Depending on the data stored in the memory cells of a memory device, all of the memory cells may be in binary state A or in binary state B, or fewer memory cells may be in one of the binary states, or the same number of memory cells may be in each binary state. A binary state of memory cells may be intentionally changed, for example, when stored data is intentionally replaced by different data, or, as explained above, unintentionally, as a result of leakage of electrons from the floating gates of the memory cells, which occurs naturally with the passage of time. Unintentional changes in the binary states of memory cells result in erroneous data/bits. Erroneous data/bits (the term "bad bits" is oftentimes used) are correctible (and the data stored therein recoverable), at least to some extent, by using correction means such as an Error Correction Code ("ECC") mechanism.

Figure 5:
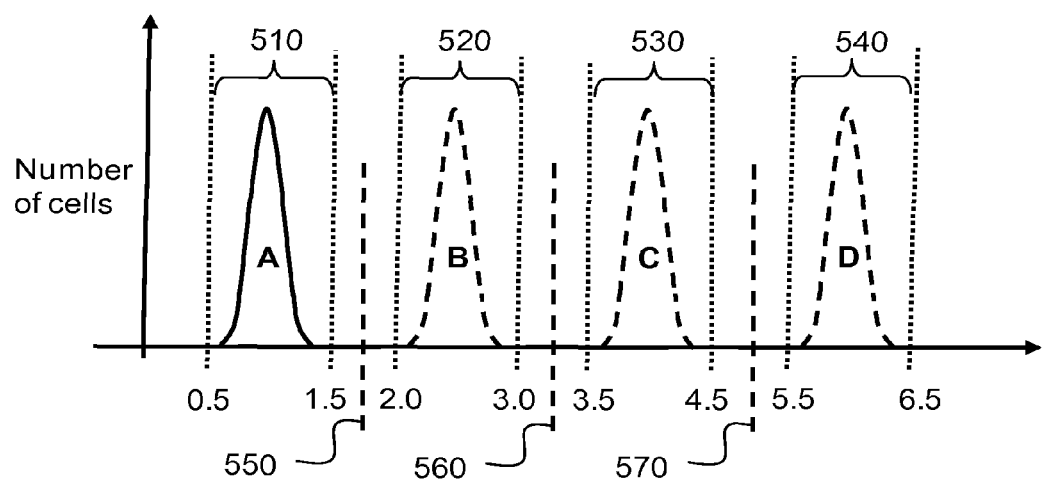
FIG. 5 (prior art) shows distributions of threshold voltages of "2 bits-per-cell" charge-storing memory cells before electrons are injected into their floating gates, and as more and more electrons are injected into their floating gates.

FIG. 5 shows distributions of threshold voltages of "2-bits-per-cell" memory cells before electrons are injected into their floating gates (state "A"), and as more and more electrons are injected into their floating gates (states "B"-"D"). The threshold voltage distributions shown in FIG. 5 are similar to the threshold voltage distributions shown in FIG. 4, except that FIG. 4 pertains to "1-bit-per-cell" memory cells and FIG. 5 pertains to "2-bits-per-cell" memory cells. A "2-bits-per-cell" memory cell can store one of the four binary states "00", "01", "10", and "11", which are here designated as binary states "A", "B", "C", and "D". Which binary state represents which binary value depends on the convention used. For example, binary state "A" may represent the binary value "00"; binary state "B" may represent the binary value "01", etc.

In binary state "A", no electrons at all have been injected into the floating gate of the memory cells, and the threshold voltage Vth of the memory cells has its native value, yielding threshold voltage distribution 510 of between 0.5 V and 1.5 V. In binary state "B", a small number of electrons has been injected into the floating gate, and the threshold voltage Vth of the memory cells rises slightly, resulting in a threshold voltage distribution 520 of between 2.0 V and 3.0 V. In binary state "C", a slightly larger number of electrons has been injected into the floating gate of the memory cells, and the threshold voltage Vth of the memory cells rises to a greater extent, resulting in a threshold voltage distribution 530 of between 3.5 V and 4.5 V. In binary state "D", a larger number of electrons has been injected into the floating gate of the memory cells, and the threshold voltage Vth of the memory cells rises greatly, resulting in a threshold voltage distribution 540 of between 5.5 V and 6.5 V. Three read reference voltages 550, 560, and 570 are required to distinguish between the four binary states. That is, they are used to program data into and to read data from 2-bit cells. During programming operations, reference voltages 550, 560 and 570 are used also as "verify reference voltages". Briefly, a memory cell is programmed step by step, and, after each programming step the verify reference voltages are used to check whether the memory cell holds the data intended for it.

Estimation of values of quantities related to memory cells' self-discharge may be performed by using n (n≧1) large groups of memory cells of a regular user storage area of a storage device. The term "values of quantities" is used herein in the context of physical quantities, which may be, for example, an elapsed time, a wear level of memory cells, an effect of temperature on wear or on time, etc. Of course, the term "value" (e.g. bit value, data value) is also used herein as corresponding to the binary state of memory cells of a particular group. Therefore, the term "value" should be construed according to the context in which it is used. A calculated number that represents binary state changes in a particular group of memory cells is called herein a "bit-change dependent value".

With reference to FIG. 6A, one group of memory cells 610 (i.e., n=1) is used to estimate a cell discharge related value that is a function of one bit-change dependent value (i.e., bit-change dependent value D1). D1, whose value changes over time as the memory cells transition between binary states, represents the distribution, at any given time, of binary states of the group of memory cells 610 collectively. The memory cells' discharge related value may equal a function of the bit-change dependent value D1 without temperature compensation (e.g., cells' discharge related value=f(D1)).

Selecting One Group of M Memory Cells for Time Estimations

If one group of M memory cells (e.g., group 610 of FIG. 6A) is used to estimate, for example, elapsed times, then initial data is stored in the M memory cells at time to such that each of the M memory cells is initially set (i.e., programmed) to a predetermined binary state. The range of possible binary states depends on the number of bits that each cell of the memory cells can store. For example, if each of the M memory cells can store 2 bits, then the binary state of each memory cell can be any of the four (i.e., $2^2$) binary states "00", "01", "10", and "11". In general, if a memory cell can store k bits, it can be in (i.e., programmed to) any one of N binary states $N_1, N_2, N_3, \ldots$, etc., where $N=2^k$.

Each of the M memory cells may initially be set to (i.e., programmed to store) a binary state $N_i$ corresponding to a maximum amount of electric charge that can be stored in the cell. The term "initial binary state" and the term "initial data" are used interchangeably, as a specific binary state represents specific data, and vice versa. A binary state corresponding to the maximum electric charge is referred to herein as a "maximum charge value", or "maximum charge data". After the M memory cells are set to an initial binary state $N_i$ (i.e., after the M memory cells are initially programmed to the binary state $N_i$), the memory cells, undergo a self-discharge process (i.e., they self charge over time) and the time elapsing from time $t_0$ until time $t_1$ can be estimated by detecting how many of the M memory cells have transitioned, from time $t_0$ until time $t_1$, from the initially programmed binary state to one or more other binary states, and by correlating or converting a bit-change dependent value, which is derived from such transitions, to an elapsed time (or other discharge-determining condition) by using a "bit-change dependent value-to-time" (or bit-change dependent value-to-other discharge-determining condition) function that can be determined, e.g., empirically. For convenience a "bit-change dependent value-to-time" function may be referred to as a "value-to-time" function.

According to the above procedure, the selected memory cells are regular memory cells that are used for the purpose of timekeeping and not used as regular memory cells (i.e. not used to store user data or other data). However, it is also possible to use, for the purpose of timekeeping, regular memory cells that are used to store user or other data. In this case, the M memory cells may be selected for time estimations based on whether user data that they hold is suitable for time estimation. If such memory cells can be found, the user data stored in each memory cell is regarded as the "initial data" of the memory cell, and the memory cell is regarded as being set to an "initial binary state". This is in contrast to the above procedure (i.e. using certain memory cells for only the purpose of timekeeping), in which each of the M memory cells was specifically programmed to an initial binary state corresponding to a maximum amount of electric charge that can be stored in the cell.

Because user data is random, memory cells that hold user data or portions thereof may contain small amounts of electric charge (cf. the maximum amount of electric charge corresponding to the initial state, for the case in which memory cells are set aside and used only for timekeeping). Detecting changes in the binary state(s) of the M memory cells in order to determine elapsed times may be less accurate if the initial amount of electric charge stored in the memory cells is small. Therefore, in the case of using memory cells that are also used for regular data-storing purposes, the M memory cells may be selected such that the user data stored in them (i.e. their binary states) indicates that the cells store a relatively large amount of electric charge. Alternatively, in the case of using memory cells that are also used for regular data-storing purposes, it may be preferable to detect the total number of bad bits in the group of cells rather than to detect the number of cells in each binary state.

The greater the number of binary state transitions that have occurred in the group of M memory cells, the greater the amount of data that has become corrupted in the memory cells, the greater the number of bits that have become erroneous (i.e., bad) in the group of memory cells, and the greater the amount of time that has elapsed. The bit-change dependent value, which is used to determine the amount of time that has elapsed, may thus be derived from the binary state distribution across the M memory cells, or from the number of bad bits in the group of memory cells (or a percentage of the bad bits in that group).

When detecting the number of bad bits rather than the number of binary state changes in user data to estimate the amount of elapsed time, an error code correction mechanism is applied to the user data in order to correct the user data or, put another way, to "recover" the original user data (the recovered user data may be identical to the original user data, or similar data). The number of bad bits is detected by comparing the "aged" user data (i.e., the user data before it is corrected) to the recovered user data. As stated, the greater the number of bad bits detected, the greater the amount of time that has elapsed. The number of bad bits in the group of memory cells is referred to hereinafter as a "bad bits value" or a "bad bits count".

If the cell-discharge related value is not an elapsed time but a wear level of memory cells, the bit-change dependent value of each selected group of memory cells is or represents an actual number of bad bits (rather than the distribution of binary states) of that group of memory cells. The actual number of bad bits in a group of memory cells is, then, compared to a normally expected number of bad bits and, based on the comparison result, a determination is made whether, on the average, the memory cells wear as expected or faster than expected. As part of this determination, the actual average wear level of the cells may be estimated. The actual average wear level may also be determined as a function of the number of bad bits. The expected number of bad bits, hence the expected average rate of wear, is known by means of previous empirical testing.

If the group of M memory cells is held under extreme temperature conditions (e.g., above 40° C. or below 5° C.) or the memory cells undergo frequent extreme temperature changes (e.g., from 10° C. to 35° C.), the elapsed time estimation result may be inaccurate. The problem caused by extreme temperature conditions/changes is mitigated by using two or more groups of memory cells, as explained below.

With reference to FIG. 6B, there are n (n>1) groups of memory cells and n bit-change dependent values "D1", "D2", . . . , "Dn" that respectively represent the distributions of binary states of the n groups of cells at any given time: bit-change dependent value "D1" represents the binary state distribution of group 610; bit-change dependent value "D2" represents the binary state distribution of group 620, and so on. Unlike the case where only one group of memory cells is used (as schematically shown, e.g., in FIG. 6A), here the cells' self-discharge related value is a function of (i.e., determined by using) multiple bit-change dependent values D1 (derived from K1 memory cells 610), D2 (derived from K2 memory cells 620), . . . , Dn (derived from Kn memory cells 630). For example, the cells' discharge related value may equal a function of the multiple bit-change dependent values D1, D2, . . . Dn (e.g., cells' discharge related value=f(D1, D2, . . . Dn) with temperature compensation) as explained below in more detail. The determination may be performed at the given time by (i) detecting, for each of the n groups, a respective distribution of binary states of the programmed charge-storing memory cells relative to the programmed binary states thereof; (ii) calculating, for each of the n groups, a value Di representative of the respective distribution of binary states; and (iii) converting the calculated values D1, D2, D3, etc, to a discharge-determining condition. If n>1, as schematically shown in FIG. 6B, different groups of memory cells (i.e., groups 610, 620, . . . , 630) may include different numbers of memory cells. For example, group 610 may include $10^5$ memory cells; group 620 may include $1.5 \times 10^5$ memory cells; group 630 may include $10^6$ memory cells; etc.

Selecting Multiple Groups of M Memory Cells for Time Estimations

The n groups of memory cells are selected such that at least some of the groups have different self-discharge characteristics. Different self-discharge characteristics/behavior can be imparted to a particular group of memory cells by exerting more wear on that group's memory cells more than on memory cells of the other groups. Wear can be controllably applied to a memory cell by controlling the number of erasing cycles applied to it. The way different self-discharge characteristics of groups of memory cells are used to estimate elapsed times is described below.

In the simplest case, n=2; i.e., there are two groups of memory cells and each group of memory cells has different self-discharge behavior. Each of the two groups is simultaneously data-wise initialized and permitted to self-discharge. (The term "initialized" is not meant to exclude the case in which user data is used as the initial data, i.e. in which the memory cells are not programmed to initial states.) A memory cell having greater wear (i.e., higher wear level) loses charge faster than a memory cell having less wear.

Therefore, the difference between the number of bad bits in one group of memory cells and the number of bad bits in the other group of memory cells increases over time. This phenomenon is used to mitigate the effect of temperature on the estimation results because temperature affects the two groups in substantially the same way. While temperature increases the number of bad bits of both groups of memory cells to relatively the same extent, the increasing difference between the numbers of bad bits of the two respective groups over time is relatively independent of temperature effects. Thus, the increasing difference between the numbers of bad bits of the two respective groups over time may be used to measure or estimate elapsed time based on self-discharge so as to effectively overcome temperature effects.

The self-discharge of one or more groups of memory cells is also used to determine whether memory cells wear at the expected rate (i.e., normally) or faster. The way a single group of memory cells and n (n>1) groups of memory cells are used to estimate elapsed times and to determine normal/abnormal wear of memory cells is described below.

Figure 7A:
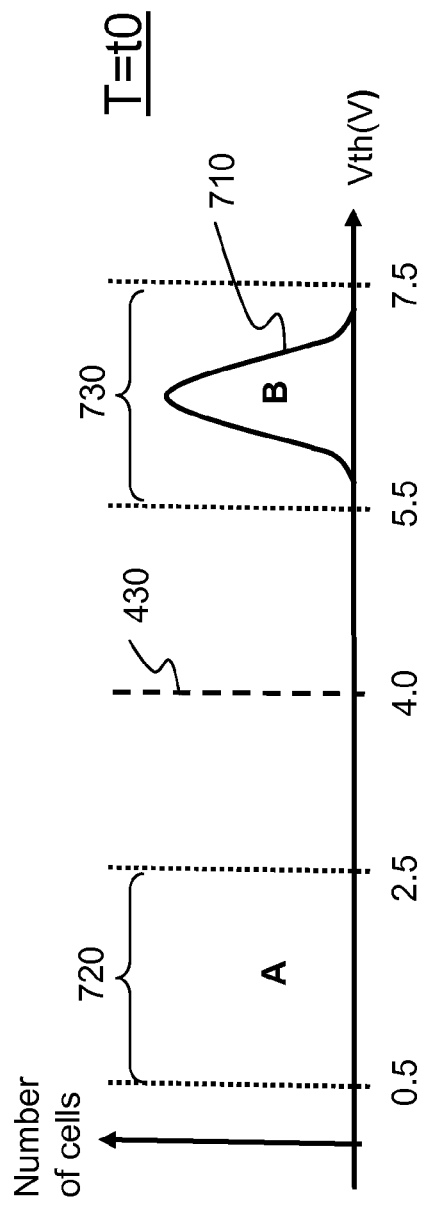
FIGS. 7A through 7C demonstrate the effect of time on the binary states of a group of "1 bit-per-cell" charge-storing memory cells.
Figure 7B:
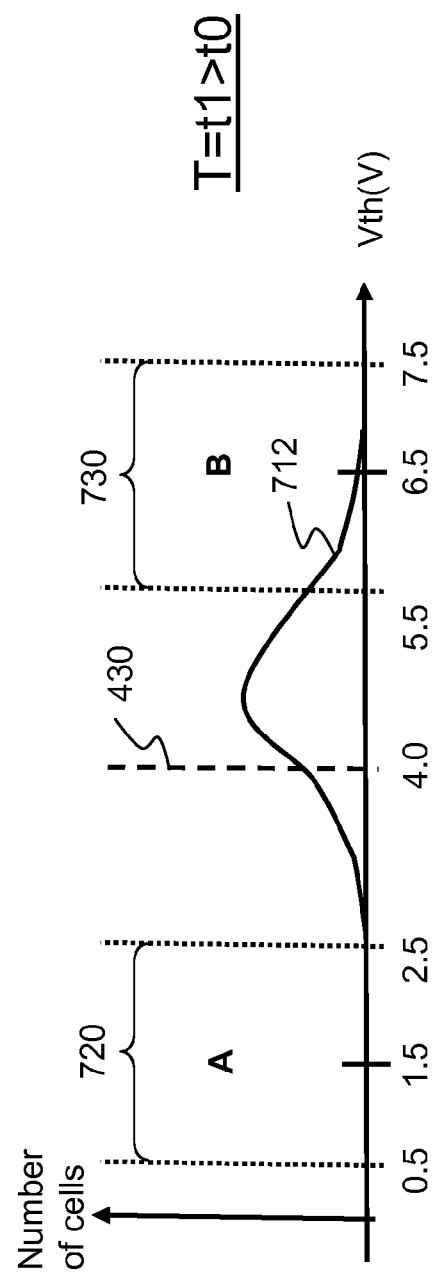
Figure 7C:
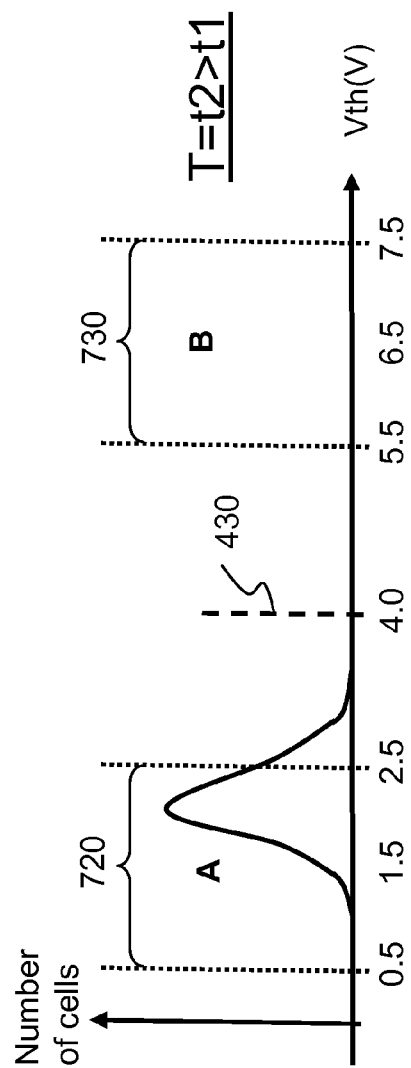

FIGS. 7A, 7B and 7C show binary states changes in a group of M "1 bit-per-cell" memory cells at different times according to an example embodiment. With each binary state is associated a fixed range of threshold voltages. In FIGS. 7A through 7C, a range of threshold voltages 720 (i.e., the voltage range from 0.5v to 2.5v) is associated with binary state "A", and a range of threshold voltages 730 (i.e., the voltage range from 5.5v to 7.5v) is associated with binary state "B".

Referring to FIG. 7A, it shows the M memory cells initially charged, at time t0, with a maximum electric charge corresponding to binary state "B". Binary state "B is referred to hereinafter as the "initial binary state". Because memory cells are not structurally identical, charging them with the same amount of electric charge results in them having different threshold voltages, as curve 710 shows. Nevertheless, all the M memory cells are set to the same initial binary state "B" regardless of the differences in their initial threshold voltages.

With reference to FIG. 7B, as the M memory cells lose electrons, their threshold voltage gradually decreases. The shape of threshold voltage distribution curve at time t1 (t1>t0) differs from the initial shape of curve 710 because the rate at which electrons are lost differs from one memory cell to another, hence the deviation in the shape of curve 712 from the shape of curve 710.

In order to calculate an elapsed time period, a distribution of binary states (which is sometimes referred to herein also as "binary-state distribution") of the M non-volatile memory cells is detected in order to identify the "contribution" of each of binary states "A" and "B" to the elapsed time period. A relative "state weight" (i.e., W(i), i=A, B) is calculated for each binary state and the relative state weights are added up. A "state weight" is the multiplication product of the percentage ($P_{STATE}$) of memory cells currently in a particular binary state and a value ($V_{STATE}$) that represents the particular binary state. The summation result of the state weights for all the binary states is an average discharge value $\nabla_{DISCHARGE}$ (which is referred to herein as a "state-weighted sum" and as the bit-change dependent value, e.g., D1, etc. from FIGS. 6A and 6B). The average discharge value $\nabla_{DISCHARGE}$ reflects the time that has elapsed from the time at which the initial electric charge was stored in the memory cells, i.e., from the time at which the memory cells were set to the initial binary state, to a current point in time. Accordingly, the state-weighted sum $\nabla_{DISCHARGE}$ is calculated from the binary-state distribution of the M non-volatile memory cells using equation (3):

$$\nabla_{DISCHARGE_{(t)}} = W(A) + W(B) = P_{STATE(A)}V_{STATE(A)} + P_{STATE(B)}V_{STATE(B)} \quad (3)$$

where W(A) and W(B) respectively denote the weights of binary state A and binary state B. It may be noted that state weights are used rather than merely the percentages ($P_{STATE}$) in order for the value of the average discharge value $\nabla_{DISCHARGE}$ to change monotonically over time.

The value representing a binary state may be, for example, an average value of the threshold voltage range of that state. For example, the value representing binary state "A" may be 1.5V, which is the average voltage of threshold voltage range 720. Likewise, the value representing binary state "B" may be 6.5V, which is the average voltage of threshold voltage range 730. In general, the value representing binary state "A" may be any voltage lower than read reference voltage 430, and the value representing binary state "B" may be any voltage higher than read reference voltage 430.

The threshold voltage of some of the M memory cells may reside within the range 4V-5.5V and the threshold voltage of other M memory cells may reside within the range 2.5V and 4.0V. Nevertheless, these memory cells are also useful in estimating elapsed times because, for the purpose of estimating elapsed time periods or any other cells-discharge related value, it does not matter whether the threshold voltage of a memory cell remains in a "natural" voltage range (i.e., ranges 720 and 730) or falls outside of it.

Memory cells are, therefore, divided into two groups with respect to read reference voltage 430: a memory cell is in binary state A if its threshold voltage is lower than read reference voltage 430, which is 4.0V in this example, or in binary state B if its threshold voltage is higher than read reference voltage 430. Determining each of the memory cells as belonging either to binary state A or to binary state B (as per the example shown in FIGS. 7A, 7B, and 7C) ensures that each of the M memory cells contributes some weight to the calculation of elapse time periods and, thus, to a reliable time estimation.

Calculating an Elapsed Time Period at Time t1 using 2-State Memory Cells

Saying that a memory cell is a "2-state" cell and saying that the memory cell is of the "1-bit-per-cell" type is deemed equivalent.

Figure 7D:
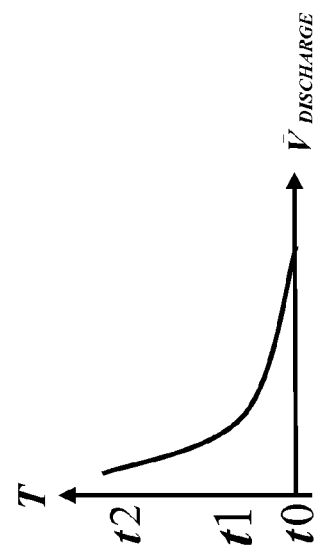
FIG. 7D shows an example average discharge value-to-time conversion function according to an example embodiment.

Referring to FIG. 7B, the elapsed time period at time t1 is found by using the binary-state distribution of the M memory cells at time t1. By way of example, it is assumed that FIG. 7B shows that at time t1 (t1>t0) 85% of the M memory cells are still in binary state B and 15% of the M memory cells are in binary state A. It is also assumed that the values representing the binary states A and B are respectively 1.5V and 6.5V. Accordingly, the time elapsed from time t0 to time t1 is found by first calculating the state-weighted sum $\nabla_{DISCHARGE}$:

$$\nabla_{DISCHARGE_{(t1)}} = W(A) + W(B) = P_{STATE(A)}V_{STATE(A)} + P_{STATE(B)}V_{STATE(B)} = 0.15 \times 1 5V + 0.85 \times 6.5V = 5.75V$$

and, then, by converting $\nabla_{DISCHARGE}$ to a corresponding elapsed time. As the average discharge value $\nabla_{DISCHARGE}$ is a known function of time (i.e., the relationship there between can be determined empirically), the elapsed time corresponding to time t1 can be found. An exemplary such empirically determined function, Time=$f(\nabla_{DISCHARGE})$, is shown in FIG. 7D. In FIG. 7D, the maximum value of $\nabla_{DISCHARGE}$ occurs at time t0 because at time t0 all (i.e., 100% of) the M memory cells are in the initial binary state B, which, as stated above, is represented by the highest value because that value is derived from the highest threshold voltage range 730. In other words, at time t0, the binary state B has a maximum "weight", and this is maintained until some memory cells transition to a lower binary state: in this example to binary state A.

Calculating an Elapsed Time Period at Time t2 using 2-State Memory Cells

Over time, the M memory cells continue to lose electrons, and their threshold voltages continue to decrease; eventually all of the cells' threshold voltages become lower than read reference voltage 430, which state is shown in FIG. 7C. As explained above, a memory cell whose threshold voltage is lower than read reference voltage 430 is deemed to be in binary state A.

The elapsed time period at time t2 is found by using the binary-state distribution of the M memory cells at time t2. By way of example, it is assumed (as stated) that at time t2 (t2>t1>t0) there are no more memory cells in binary state B and all the memory cells (100% of the M memory cells) are in binary state A. It is also assumed that the values representing the binary states A and B remain the same; i.e., 1.5V and 6.5V, respectively. Accordingly, the time elapsed from time t0 to time t2 is found by first calculating the state-weighted sum $\nabla_{DISCHARGE}$:

$$\nabla_{DISCHARGE_{(t2)}} = W(A) + W(B) = P_{STATE}(A)V_{STATE(A)} + P_{STATE(B)}V_{STATE(B)} = 1.0 \times 1.5V + 0.0 \times 6.5V = 1.5V$$

and, then, by converting $\nabla_{DISCHARGE}$ to a corresponding elapsed time by using a function such as the function shown in FIG. 7D, or a conversion table or a conversion algorithm. The maximum measurable elapsed time is the time elapsing from the time all the M memory cells are charged with the initial electric charge (i.e. all the M memory cells have been initially placed in state B) until all the M memory cells have transitioned into binary state A. Starting from the time when all the M memory cells are in binary state A, no calculation of additional elapsed time can be made because, from this point on, the value of $\nabla_{DISCHARGE}$ remains the same (in this example it remains 1.5V).

Calculating an Elapsed Time Period using 4-State Memory Cells

Figure 8C:
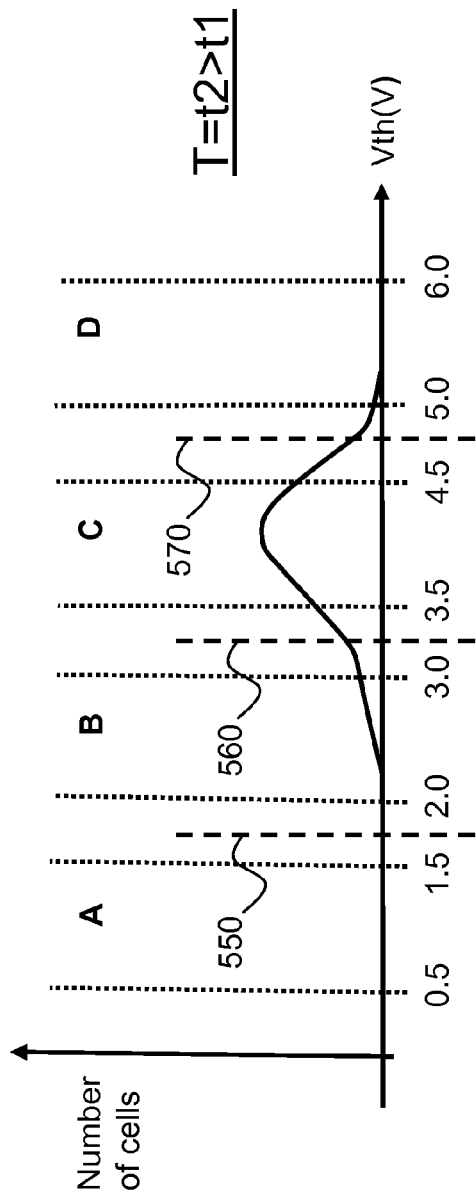

FIGS. 8A through 8D demonstrate binary states of M "2 bit-per-cell" memory cells at different times according to an example embodiment. Saying that a memory cell is a "2 bits-per-cell" and saying that the memory cell is a "4-state" memory cell is deemed equivalent. As described above, for example in connection with FIG. 7A, M memory cells can be selected for time estimations and caused to transition to the highest initial binary state by charging them with maximum charge value. By "highest binary state" is meant the binary state associated with the highest range of threshold voltages. Similarly, in the 4-state case, the M 2-bit-per-cell memory cells are initially set to binary state D, which is the highest binary state, as shown in FIG. 8A at 540, and changes in the binary states of the M memory cells, relative to the initial binary state D, are indicative of elapsed times.

FIG. 8A shows the M memory cells initially charged at time t=t0 with a maximum electric charge corresponding to binary state "D". As explained above in connection with FIG. 6A, even though the M memory cells are all charged with the same amount of electric charge, after the charging the memory cells have different threshold voltages due to individual differences between cells, resulting in a range or distribution of threshold voltages, as also seen in curve 810 of FIG. 8A. Still, at time $t_0$, all of the M memory cells are set to the same initial binary state D, despite the variation in the cells' initial threshold voltages (the extent of variation is not such that any of the memory cells' initial threshold voltages fall below read reference voltage 570, which would render a cell in state C).

With reference to FIG. 8B, over time, the M memory cells lose electrons and their threshold voltages decreases. The shape of the threshold voltage distribution curve 812 at time t1 (t1>t0) differs from the initial curve 810 shown in FIG. 8A for the reason mentioned above in connection with curve 710 and 712. In order to calculate an elapsed time period, the "contribution" of each of binary states "A", "B", "C", and "D" to the elapsed time period is calculated by calculating a relative "state weight" for each binary state and summing up the relative state weights, as described above and also shown below. With each of binary states A through D is associated a fixed range of threshold voltages: threshold voltage range 510 is associated with binary state "A"; threshold voltage range 520 is associated with binary state "B"; threshold voltage range 530 is associated with binary state "C", and threshold voltages range 540 is associated with binary state "D". The value representing binary state "A" may be 1.0V, which is the average voltage of threshold voltage range 510; the value representing binary state "B" may be 2.5V, which is the average voltage of threshold voltage range 520; the value representing binary state "C" may be 4.0V, which is the average voltage of threshold voltage range 530, and the value representing binary state "D" may be 5.5V, which is the average voltage of threshold voltage range 540.

Calculating an Elapsed Time Period at Time t1 using 4-State Memory cells

Referring again to FIG. 8B, the elapsed time period at time t1 is found by using the binary-state distribution of the M memory cells at time t1. By way of example, it is assumed that FIG. 8B shows that at time t1 60% of the M memory cells are in binary state C and 40% of the M memory cells are in state D. It is also assumed that the values representing the binary states C and D are respectively 4.0V and 5.5V. Accordingly, the time elapsed from time t0 to time t1 is found by calculating $\overline{V}_{DISCHARGE}$:

$$\overline{V}_{DISCHARGE(t1)} = W(A)+W(B)+W(C)+W(D) = P_{STATE(A)}V_{STATE(A)} + P_{STATE(B)}V_{STATE(B)} + P_{STATE(C)}V_{STATE(C)} + P_{STATE(D)}V_{STATE(D)} = 0.0 \times 1.0 + 0.0 \times 2.5 + 0.6 \times 4.0V + 0.4 \times 5.5V = 4.6V$$

and, then, by converting $\overline{V}_{DISCHARGE}$ to the corresponding elapsed time by using, for example, a function analogous to the function shown in FIG. 7D, or a conversion table or a conversion algorithm.

Calculating an Elapsed Time Period at Time t2 using 4-State Memory Cells

With reference to FIG. 8C, over time, as the M memory cells continue to lose electrons, which means that their threshold voltage continues to decrease, more memory cells transition from binary state D to binary state C, and some memory cells transition from binary state C to binary state B. The elapsed time period at time t2 is found by using the binary-state distribution of the M memory cells at time t2. By way of example, it is assumed that FIG. 8C shows that at time t2 20% of the M memory cells are in binary state B, 75% of the M memory cells are in state C, and 5% of the M memory cells are in state D. It is also assumed that the values representing the binary states B, C and D are respectively 2.5V, 4.0V and 5.5V. Accordingly, the time elapsed from time t0 to time t2 is found by calculating $\overline{V}_{DISCHARGE}$:

$$\overline{V}_{DISCHARGE(t2)} = W(A)+W(B)+W(C)+W(D) = P_{STATE(A)}V_{STATE(A)} + P_{STATE(B)}V_{STATE(B)} + P_{STATE(C)}V_{STATE(C)} + P_{STATE(D)}V_{STATE(D)} = 0.0 \times 1.0 + 0.20 \times 2.5 + 0.75 \times 4.0V + 0.05 \times 5.5V = 3.775V$$

and, then, by converting $\overline{V}_{DISCHARGE}$ to the corresponding elapsed time by using, for example, a function analogous to the one shown in FIG. 7D, or a conversion table or a conversion algorithm.

Calculating an Elapsed Time Period at Time t3 using 4-State Memory Cells

Figure 8D:
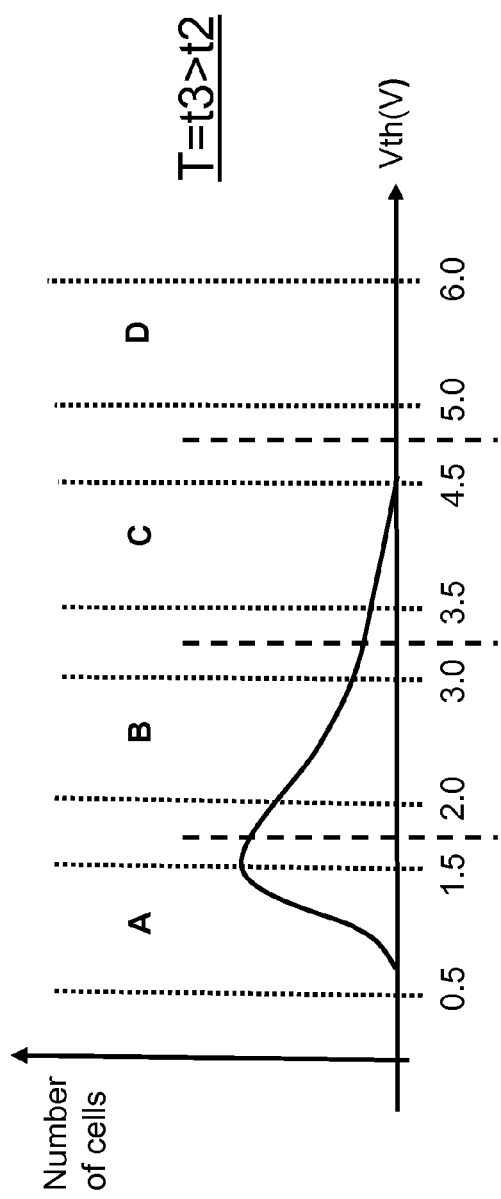

With reference to FIG. 8D, as the M memory cells continue to lose more electrons, their threshold voltages continue to decrease: some of them transition from binary state D to binary state C; other memory cells transition from binary state C to binary state B; and other memory cells transition from binary state B to binary state A.

The elapsed time period at time t3 (t3>t2) is found by using the binary-state distribution of the M memory cells at time t3. By way of example, it is assumed that FIG. 8D shows that at time t3 35% of the M memory cells are in binary state A; 50% of the M memory cells are in binary state B, 15% of the M memory cells are in state C, and no memory cells are in binary state D. It is also assumed that the values representing the binary states A, B, C and D are, respectively, 1.0V, 2.5V, 4.0V and 5.5V. Accordingly, the time elapsed from time t0 to time t3 is found by calculating $\overline{V}_{DISCHARGE}$:

$$\overline{V}_{DISCHARGE(t3)} = W(A)+W(B)+W(C)+W(D) = P_{STATE(A)}V_{STATE(A)} + P_{STATE(B)}V_{STATE(B)} + P_{STATE(C)}V_{STATE(C)} + P_{STATE(D)}V_{STATE(D)} = 0.25 \times 1.0 + 0.35 \times 2.5 + 0.15 \times 4.0V + 0.0 \times 5.5 = 1.5V$$

and, then, by converting $\overline{V}_{DISCHARGE}$ to the corresponding elapsed time by using, for example, a function analogous to the one shown in FIG. 7D, or a conversion table or a conversion algorithm.

Read reference voltages 550, 560 and 570 in FIGS. 8A-8D are employed in analogous manner to that explained with respect to read reference voltage 430 in the discussion of FIGS. 7A-7C given, however, that FIGS. 8A-8D pertain to multi-bit cells, as explained in the discussion of FIG. 5 (as contrasted to single bit cells explained in the discussion of FIG. 4).

Figure 9:
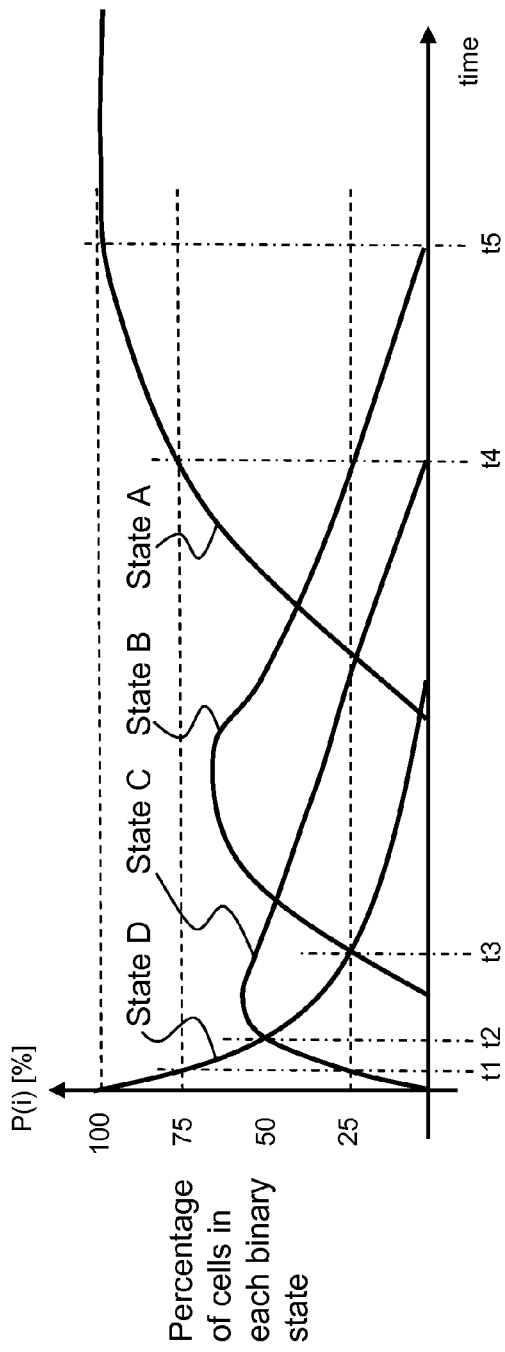
FIG. 9 is a graph showing the percentage of charge-storing memory cells in different binary states as a function of time.

FIG. 9 demonstrates the effect of elapsed time on the binary state distribution of M 4-state memory cells. The abscissa indicates time and the ordinate indicates the percentage of M memory cells in each of binary states A, B, C, and D, designated as P(i) [%]. At time t0, 100% of the memory cells are in the initial binary state D. At time t1, 75% of the memory cells are still in binary state D and 25% of the memory cells are in binary state C. At time t2, 50% of the memory cells are still in binary state D and 50% of the memory cells are in binary state C. At time t3, 25% of the memory cells are still in binary state D, 50% of the memory cells are in binary state C, and 25% of the memory cells are in binary state B. At time t4, 25% of the memory cells are in binary state B and 75% of the memory cells are in binary state A. From time t5 onwards all the memory cells are in binary state A. It will be noted that FIG. 9 does not necessarily represent the same system as FIGS. 8A-8D; the respective values $t_1$, $t_2$, etc, differ, and the memory cells may differ.

As demonstrated in FIGS. 7A through 7C and in FIGS. 8A through 8D, transition of large numbers of memory cells between binary states as a result of self-discharge is useful for estimating elapsed times. As shown below, such transitions are also useful for estimating other cell-discharge related values.

Figure 10:
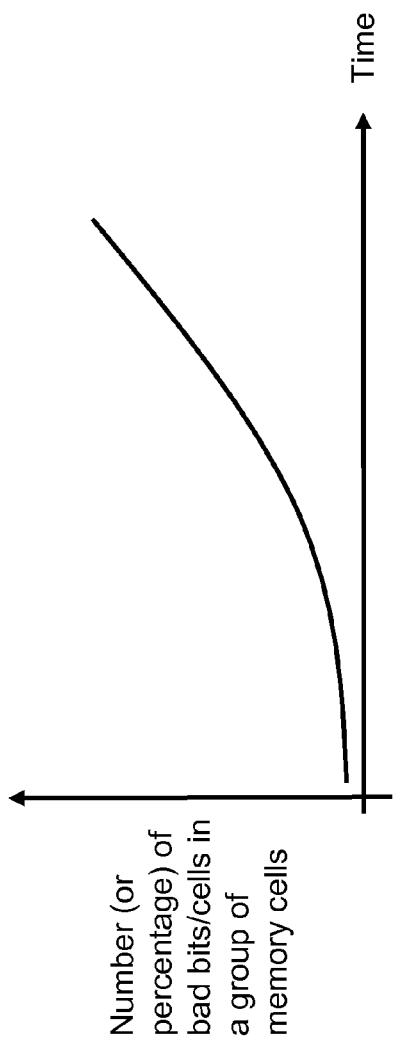
FIG. 10 is a graph showing the number of bad bits, or the percentage of bad charge-storing memory cells, in a group of memory cells, as a function of time, according to an example embodiment.

FIG. 10 is a graph showing the number of bad bits in a group of memory cells as a function of time. The number of bad bits in the memory cells and the transitions of the memory cells from one binary state to another are correlated. That is, if a group of memory cells are initially set to the same binary state (e.g., to state D, as in FIG. 8A), then any memory cell in the group whose binary state transitions from the initial binary state to any other binary state would hold one or more bad bits, the number of the bad bits depending on the number of bits-per-cell to which the memory cells are configured. In this respect, counting bad bits in a group of memory cells is deemed equivalent to detecting memory cells in that group whose binary state differs from their initial binary state. In other words, the number of bad bits (strictly speaking, the number of bits that have gone bad) is equivalent to the number of memory cells in the group that have transitioned from the initial binary state (i.e., initially programmed binary state) to a different state. An increase in the number of bad bits in the group reflects transitions of memory cells from the initial binary state to a different binary state. Therefore, a graph similar to the graph of FIG. 10 may be used to calculate elapsed time periods or other cell-discharge related values.

Figure 11:
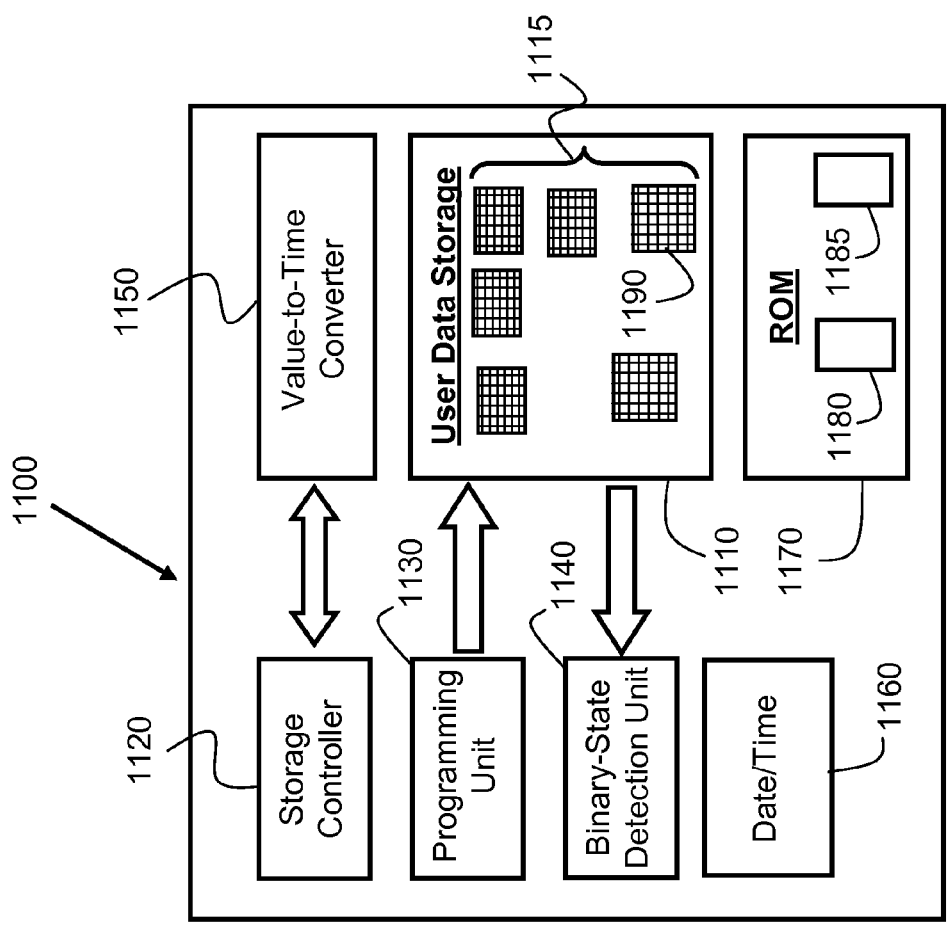
FIG. 11 is a block diagram of a storage device according to an example embodiment.

FIG. 11 is a block diagram of a storage device 1100 according to an example embodiment. Storage device 1100 includes user data storage 1110. User data storage 1110 includes a plurality of charge-storing memory cells 1115 for storing regular data, such as user data and other types of data. Storage device 1100 also includes a storage controller 1120 for managing user data storage 1110 and for performing calculations and operations associated with elapsed time period estimations and cells' wear estimations; a programming unit 1130; a binary state detection unit 1140; and a value-to-time converter 1150.

Storage controller 1120 uses programming unit 1130 to program data to the plurality of charge-storing memory cells 1115 of user data storage 1110. Storage controller 1120 may identify, from among the plurality of charge-storing memory cells 1115, a group of memory cells 1190 as being suitable for time estimations, for example, because they do not contain any data or they contain outdated data. (Note: the relative amounts of memory cells 1190 and memory cells 1115 are not drawn to scale; it is intended that memory cells 1190 to be used in making time/wear estimations will be a small fraction of total memory cells 1115, such as not to significantly detract from memory capacity of storage device 1100.) Storage controller 1120 programs initial data to memory cells 1190 in such a manner to program each of memory cells 1190 to a particular one of N (N≧2) binary states by storing in each of the memory cells 1190 an amount of electric charge corresponding to a voltage equal to or approximately equal to a threshold voltage associated with the particular binary state. For example, the amount of charge may be a maximum amount of charge that can be stored in the given memory cell. Assuming that some time has elapsed and it is desired to estimate how much time has elapsed, storage controller 1120 uses binary state detection unit 1140 to detect the current binary state of each of memory cells 1190. After the binary states of memory cells 1190 have been detected, storage controller 1120 calculates a state weight for each binary state and, then, sums up the state weights to obtain a state-weighted sum. Then, storage controller 1120 may use value-to-time converter 1150, a conversion algorithm, or a conversion table to convert the state-weighted sum into a corresponding elapsed time. The conversion may be based on a function to convert state-weighted sum to time such as the one shown graphically in FIG. 7D discussed above. The "value" converted into elapsed time is the state-weighted sum. The state-weighted sum represents the collective binary state (binary state range or distribution) of the whole group of memory cells 1190 at the time of estimation. As explained above and demonstrated, for example, in FIG. 7D, the value of the state-weighted sum decreases monotonically over time.

Concurrently with the initialization of memory cells 1190, storage controller 1120 may store real date/time information (shown as "Date/Time" 1160) in a persistent storage area such as a ROM device 1170, or alternatively, in user data storage 1110 (this variation not shown). As appropriate, storage controller 1120 may concurrently update Date/Time 1160 and re-initialize (i.e., reprogram) memory cells 1190. Storage controller 1120 may determine a current real date and time by estimating the time period elapsed from the time the memory cells were initialized and adding the estimated elapsed time period to the stored Date/Time information.

As explained above, calculation of elapsed time periods is based on a self-discharge process that each memory cell undergoes, which results in changes in the data/binary state that is initially programmed to selected memory cells. On the other hand, storage controllers of charge-storing based memory devices traditionally perform various background memory operations on the user data storage in order to ensure that regular data is not lost or corrupted over time. Refreshment of memory cells, wear-leveling, and internal housekeeping are exemplary background memory operations. Therefore, in order to allow the initial data in memory cells 1190 to "age" (i.e., in order to allow these memory cells to transition between binary states) without interference, storage controller 1120 may exclude memory cells 1190 from the traditional background memory operations. Nonetheless, storage device 1100 may store initial data 1180 in ROM 1170 so that it can be reused to reinitialize memory cells 1190. If initial data 1180 is stored in ROM 1170, storage controller 1120 may copy it to memory cells 1190 initially and, whenever it is required to reinitialize the timekeeping mechanism, recopy initial data 1180 to memory cells 1190. Storage controller 1120 may also store future time information (e.g., Date/Time 1185) in ROM device 1170 and decide to perform, defer, or refrain from performing tasks (e.g. allowing a user to play back a multimedia file, allowing a user to read data from or to write data into the storage device, etc.) depending on whether a given future point in time has passed or not, the decision being made based on stored date/time 1160 and on a currently estimated elapsed time period.

After storage controller 1120 calculates an elapsed time period, it may reset the timekeeping mechanism (e.g., by recopying initial data 1180 to memory cells 1190) and concurrently replace the outdated date/time information 1160 with current real-time date/time information. Storage controller 1120 may recopy initial data 1180 to memory cells 1190 when a predetermined condition is satisfied. Exemplary conditions are:

(1) A relatively long time (e.g., six months) has elapsed, which is shorter than the maximum measurable time period (e.g., nine months);
(2) All or some of memory cells 1190 have transitioned to the lowest binary state, which, as explained above, is the binary state associated with the lowest amount of electric charge or lowest threshold voltage range; and
(3) After a predetermined period of time has elapsed. Regarding condition (3), it is known in the art that the more electric charge a memory cell contains, the greater the rate at which its threshold voltage decreases and the better the time resolution of the timekeeping mechanism. A "better time resolution" means that a shorter time period is measurable. Therefore, under some circumstances, it may be useful to reset the timekeeping mechanism in a manner to maintain the "better resolution".

In charge-storing based memory devices, data is typically programmed to memory cells by using a charge pump. Briefly, a charge pump is an electronic circuit that uses capacitors as energy storage elements to create either a high or low voltage power source. Charge pumps are a key component in Electrically Erasable Programmable ROM ("EEPROM") and flash memory devices, as they require a high voltage pulse to "clean out" any existing data in a particular memory cell before a new value can be written into it. As charge-storing memory cells (e.g., of the flash type) are formed as matrix lines (rows) and columns, data is programmed and read by using a column detector and line drivers. Charge-storing based memory devices include a reference voltage generator for generating read reference voltages (e.g., read reference voltage 430 of FIG. 7A, and read reference voltages 550, 560, and 570 of FIG. 8A) used for the programming and reading operations. Programming unit 1130 and binary state detection unit 1140 may include a charge pump, column detectors, line drivers, etc., to enable them to perform their tasks.

Figure 13:
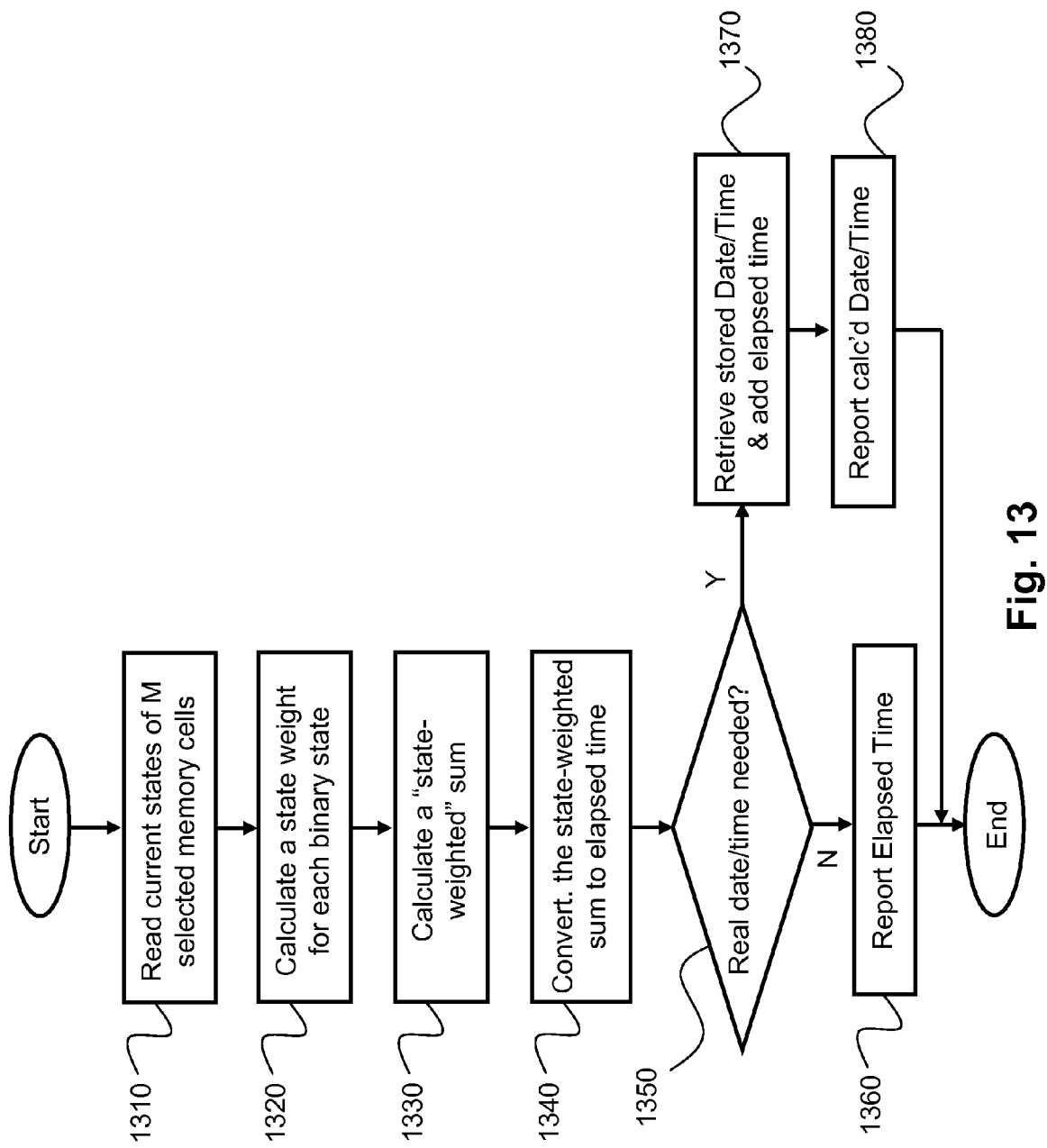
FIG. 13 is a method for estimating elapsed time periods according to an example embodiment.
Figure 14:
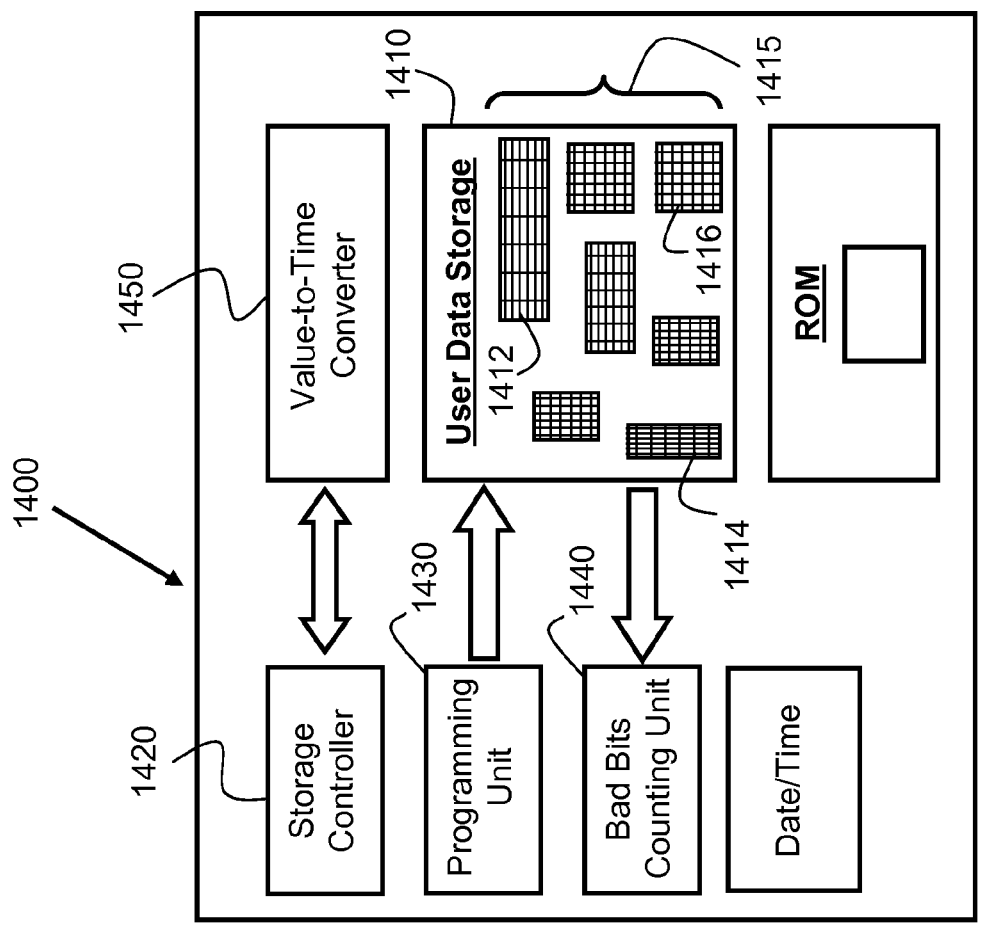
FIG. 14 is a block diagram of a storage device according to another example embodiment.

The memory cells selected by a storage controller may be physically or logically contiguous, as shown at 1190 but, if the initial data is regular data (as opposed to, e.g., the maximum charge value mentioned herein), parts of the memory cells selected for the elapsed time estimation may be physically or logically separated, as shown in FIG. 14 (the separated memory cells are shown in FIG. 14 as memory cell portions 1412, 1424, and 1416). The way storage controller 1120 estimates an elapsed time period is described in association with FIGS. 12 and 13, which are described below.

Figure 12:
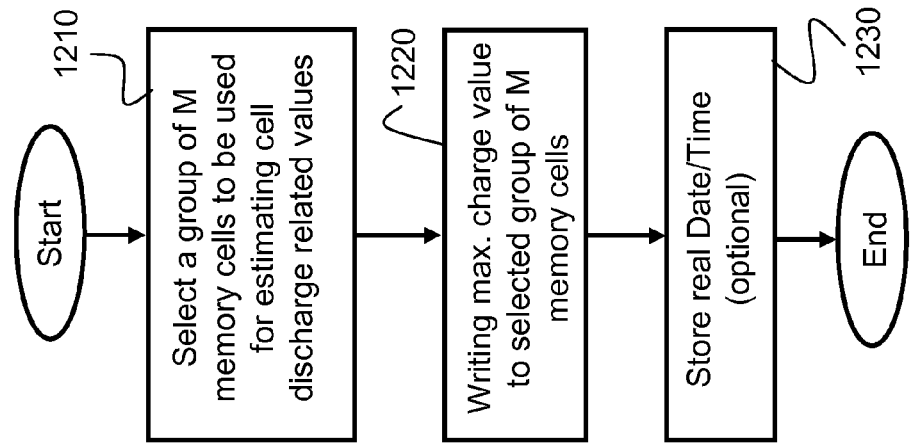
FIG. 12 is a method for preparing a storage device for estimating elapsed time periods and cells' wear according to an example embodiment.

FIG. 12 is a method for preparing a storage device, such as storage device 1100 of FIG. 11, for use in estimating cell-discharge related values such as elapsed time periods and cells' wear according to an example embodiment. FIG. 12 will be described in association with FIG. 11. At step 1210, storage controller 1120 selects memory cells 1190 in user data storage 1110 and, at step 1220, uses programming unit 1130 to write (i.e., program) a maximum charge value to them, to thereby set a highest binary state to these cells. Memory cells 1190 may include unused memory cells, and/or memory cells reserved for use in estimating cell-discharge related values (e.g., elapsed time, etc.). The number (M) of memory cells 1190 is chosen to be large enough to have reliable estimation results, but negligible compared to the overall storage capacity of user data storage 1110. For example, storage capacities of storage devices are typically 16 gigabits to 64 gigabits and M may be, for example, within the range of 100,000 memory cells to 1,000,000 memory cells. At step 1230, an optional step, storage controller 1120 stores information pertaining to the real date/time at which memory cells 1190 were initialized. Storage controller 1120 may update the real date/time information if any of the conditions described above, or some other predetermined condition, is satisfied.

FIG. 13 is a method for estimating elapsed time periods (or other cell-discharge related values) according to an example embodiment. FIG. 13 will be described in association with FIGS. 11 and 12. It is understood that the method of FIG. 12 may be deemed a part of the method of FIG. 13. In order to program, at step 1220, a maximum charge value or data, e.g., user data, to memory cells 1190, storage device 1100 is powered up by connecting it to a host and switching the host "on". Some time after the maximum charge value or data is programmed into memory cells 1190, the host's user removes storage device 1100 from the host, e.g., to set it aside for future use, and later on, the user reconnects it to the host in order to normally use it. It may be noted that the cells discharge-related procedures disclosed herein (i.e. detecting binary states or number of bad bits, calculating $\nabla_{DISCHARGE}$, converting $\nabla_{DISCHARGE}$ to elapsed time, etc.) are transparent to the user in the sense that the user does not initiate, nor is s/he aware of, the execution of these procedures.

At step 1310, storage controller 1120 uses binary state detection unit 1140 to read the current binary states of memory cells 1190 to thereby obtain the current binary-state distribution associated with memory cells 1190. At step 1320, storage controller 1120 uses the current binary-state distribution associated with M memory cells 1190 to calculate a state weight for each binary state of the memory cells. If M memory cells 1190 are 2-state cells, storage controller 1120 calculates two state weights, one state weight for each binary state, and if M memory cells 1190 are 4-state cells, storage controller 1120 calculates four state weights, one state weight for each binary state, etc.

At step 1330, storage controller 1120 calculates a state-weighted sum for memory cells 1190 by summing up the state weights and, at step 1340, storage controller 1120 converts the state-weighted sum to an elapsed time. Storage controller 1120 may convert the state-weighted sum to the elapsed time by using hardware, such as value-to-time converter 1150, or by using a conversion algorithm or a conversion table. The conversion may be based on a function to convert state-weighted sum to time such as the one shown graphically in FIG. 7D discussed above.

In addition or as an alternative to determining elapsed time, the state-weighted sum may represent the wear level of memory cells 1190 and may thereby give an indication of the wear level of the plurality of memory cells 1115. A conversion analogous to the conversion of state-weighted sum to elapsed time may be performed to obtain the wear levels. Storage controller 1120 may compare the actual wear level of memory cells 1190 to an expected wear level in order to determine whether memory cells 1190 (and probably the adjacent memory cells) are wearing at an expected i.e. normal) rate, or faster than expected, as described in more detail in connection with FIG. 23, which is described below.

At step 1350, storage controller 1120 checks whether a module, unit, application, or a host is requesting real-time date/time. If real time information is not required (shown as "N" at step 1350), then, at step 1360, storage controller 1120 reports the currently estimated elapsed time period to a module, unit, application, or to a host requesting the estimated elapsed time period. If real time information is required (shown as "Y" at step 1350), then, at step 1370, storage controller 1120 calculates a current real date/time by retrieving the stored real date/time information and adding the estimated elapsed time to the retrieved date/time. At step 1380, storage controller 1120 reports the currently calculated real date/time to the party requesting the current real date/time. Storage controller 1120 may perform certain tasks, defer certain tasks, or refrain from performing certain tasks based on the currently estimated elapsed time period or on the currently calculated real date/time (i.e., the updated real date/time).

FIG. 14 is a block diagram of a storage device 1400 according to another example embodiment. Storage device 1400 includes user data storage 1410; a storage controller 1420; a programming unit 1430; a value-to-time converter 1450, and a bad bits counting unit 1440. Storage device 1400 functions substantially in the same way as storage device 1100, except that storage device 1400 uses a bad-bit counting device 1440 instead of a binary-state detection unit 1140 (discussed below) and that storage controller 1120 of storage device 1100 uses, as the initial data, predetermined data (i.e. cells charged to the maximum charge) that is optimal in terms of estimating elapsed times or cells' wear, whereas storage controller 1420 of storage device 1400 uses regular user data or another type of data as initial data that is not necessarily optimal. The regular user or other type of data that storage controller 1410 uses for elapsed time estimations or for cells' wear estimations may be stored in user data storage 1410, for example, by the user of the storage device, and it may be occasionally changed by the user. Because data which is stored by a user in user data storage 1410 is random, storage controller 1420 selects particular memory cells, among the plurality of user data storage memory cells 1415, for time and/or cells' wear estimations based on the data held by the cells: the memory cells to be used for time/wear estimations should hold optimal data or at least data that allows storage controller 1420 to count bad bits. As mentioned, portions of the selected memory cells may be separated (i.e., the memory cells may be non-contiguous). By way of example, storage controller 1420 selects a group of memory cells that is split into three separated portions of memory cells: portions 1412, 1414, and 1416. (Note: as discussed with reference to FIG. 11, the relative amounts of memory cells 1412, 1414, and 1416 selected for use in making time/wear estimations and memory cells 1415 are not drawn to scale.)

After storage controller 1420 selects the memory cells (i.e., in this example portions 1412, 1414, and 1416) for time estimation or for cell wear estimation, storage controller 1420 uses bad bits counting unit 1440 to read the regular data from the selected memory cells. Then, storage controller 1420 uses bad bits counting unit 1440 to count the number of bad bits in the data held in portions 1412, 1414, and 1416 relative to the original data, or relative to data that is similar to the original data. Bad bits counting unit 1440 may include or use an error correction mechanism to facilitate counting of the bad bits. Then, storage controller 1420 may use value-to-time converter 1450 or a conversion algorithm or table to convert the number of bad bits, or the percentage of bad bits, in the data to elapsed time or to cells' wear. The conversion of bad bits count or percentage to wear level may be based on a function analogous to the function employed to convert state-weighted sum to time, such as that shown graphically in FIG. 7D discussed above, but where $V_{DISCHARGE}$ is replaced by the number or percentage of bad bits. The "value" converted into elapsed time or into cells' wear level is, in this case, the number of bad bits (or the percentage of bad bits) in the data, which increases monotonically over time.

Figure 15:
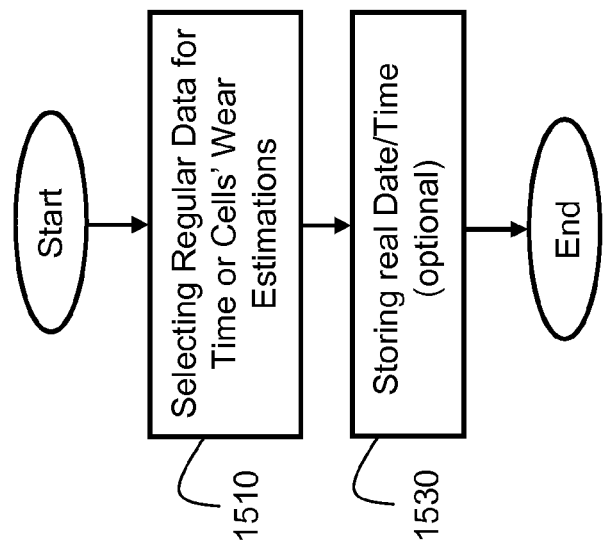
FIG. 15 is a method for preparing a storage device for estimating elapsed time periods and cells' wear according to another example embodiment.

FIG. 15 is an exemplary method for preparing a storage device, such as storage device 1400 of FIG. 14, for estimating elapsed time periods and cells' wear. FIG. 15 will be described in association with FIG. 14. At step 1510, storage controller 1420 selects M memory cells (e.g., memory cell portions 1412, 1414, and 1416) that hold regular user data or another type of regular data that has been found suitable for time estimations and cells' wear estimations. (Stating that storage controller 1420 selects M memory cells that hold user regular data or another type of regular data which that has been found suitable for time estimations and cells' wear estimations and stating that storage controller 1420 selects regular user data or another type of regular data that has been found suitable for estimating elapsed time periods and cells' wear is deemed equivalent. For convenience, "regular user data" may also be referred to herein as "regular data.") At step 1530, an optional step, storage controller 1420 stores real date/time information. Storage controller 1420 may update the real date/time information if any of the conditions described above, or some other predetermined condition, is satisfied.

Figure 16:
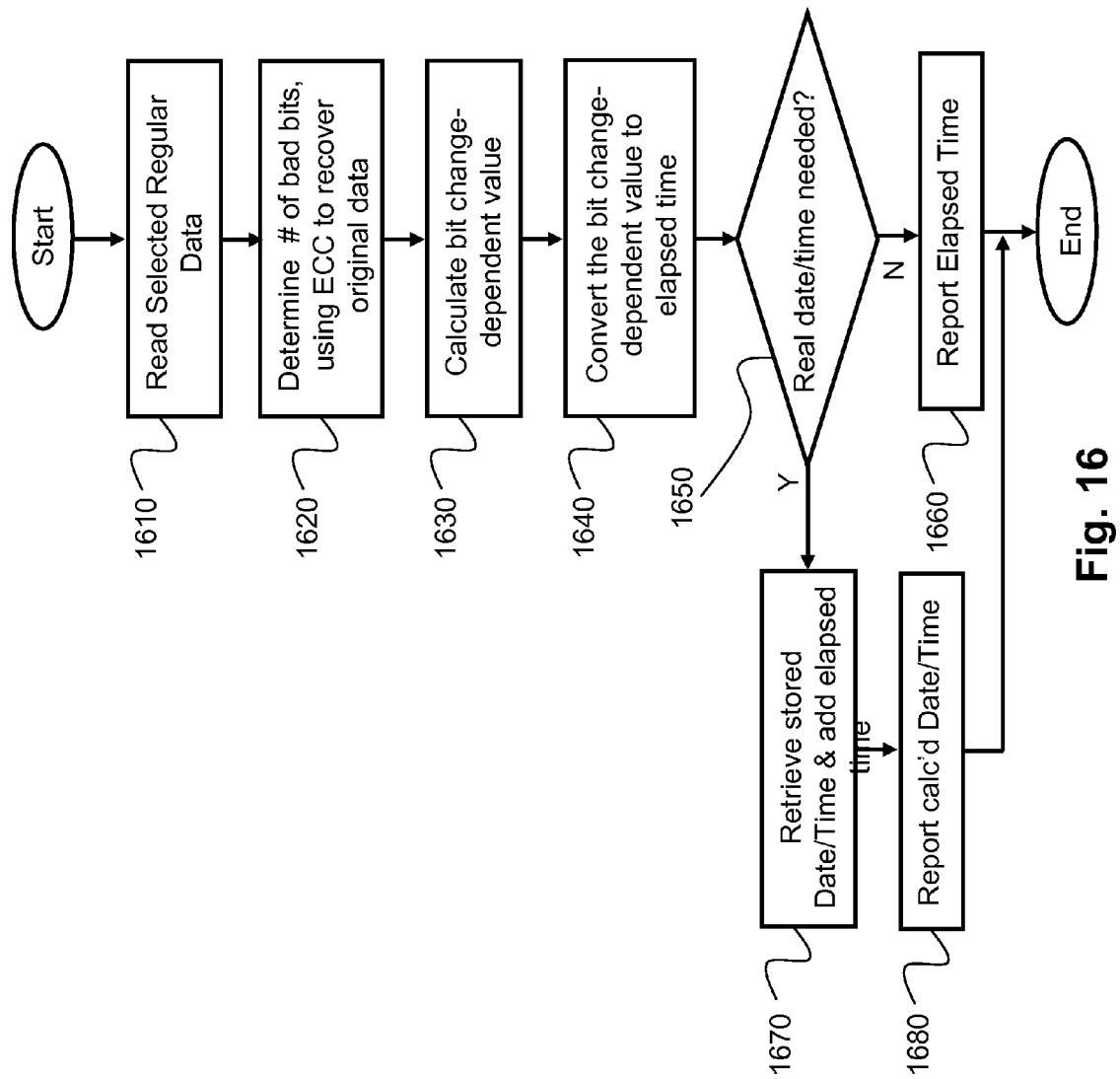
FIG. 16 is a method for estimating elapsed time periods according to another example embodiment.

FIG. 16 is an exemplary method for estimating elapsed time periods. FIG. 16 will be described in association with FIG. 14. It is understood that the method of FIG. 15 may be deemed a part of the method of FIG. 16. At step 1610, storage controller 1420 reads regular data from memory cells portions 1412, 1414, and 1416. A data bit is regarded as a "bad bit" if its value differs from its original (i.e., initial) value. Because the regular data changes over time due to self-discharge of the memory cells, to estimate the elapsed time the (corrupted) regular data is recovered, and then the number (or percentage) of bad bits in the data is detected by comparing the recovered regular data to the current (i.e., non-recovered) version of the regular data. Therefore, at step 1620, storage controller 1420 uses an ECC mechanism (which may be part of bad bits counting module 1440) to recover the data held in memory cells portions 1412, 1414, and 1416. Then, storage controller 1420 compares the recovered data to the current data and, based on the comparison results, counts the total number of bad bits (bit changes) in the (current) data. Storage controller 1420 may use a comparator to compare the recovered user data to the non-recovered user data.

At step 1630, storage controller 1420 calculates a bit change-dependent value, which, in this embodiment, is the total number of the bad bits in portions 1412, 1414, and 1416. At step 1640, storage controller 1420 may convert the bit change-dependent value to an elapsed time period (or other cell-discharge dependent quantity), for example, by using an empirical "bit change-dependent value-to-time" function (or bit change-dependent value-to-other quantity function), as discussed above. Storage device 1420 may convert the bit change-dependent value to the elapsed time (or other cell-discharge dependent quantity) by using hardware such as value-to-time converter 1450 of FIG. 14, or by using a conversion table or a conversion algorithm. The conversion may be based on a function analogous to the function employed to convert state-weighted sum to time, such as that shown graphically in FIG. 7D, as has been discussed above. Steps 1650, 1660, 1670, and 1680 are respectively similar to steps 1350, 1360, 1370, and 1380 of FIG. 13.

Figure 17:
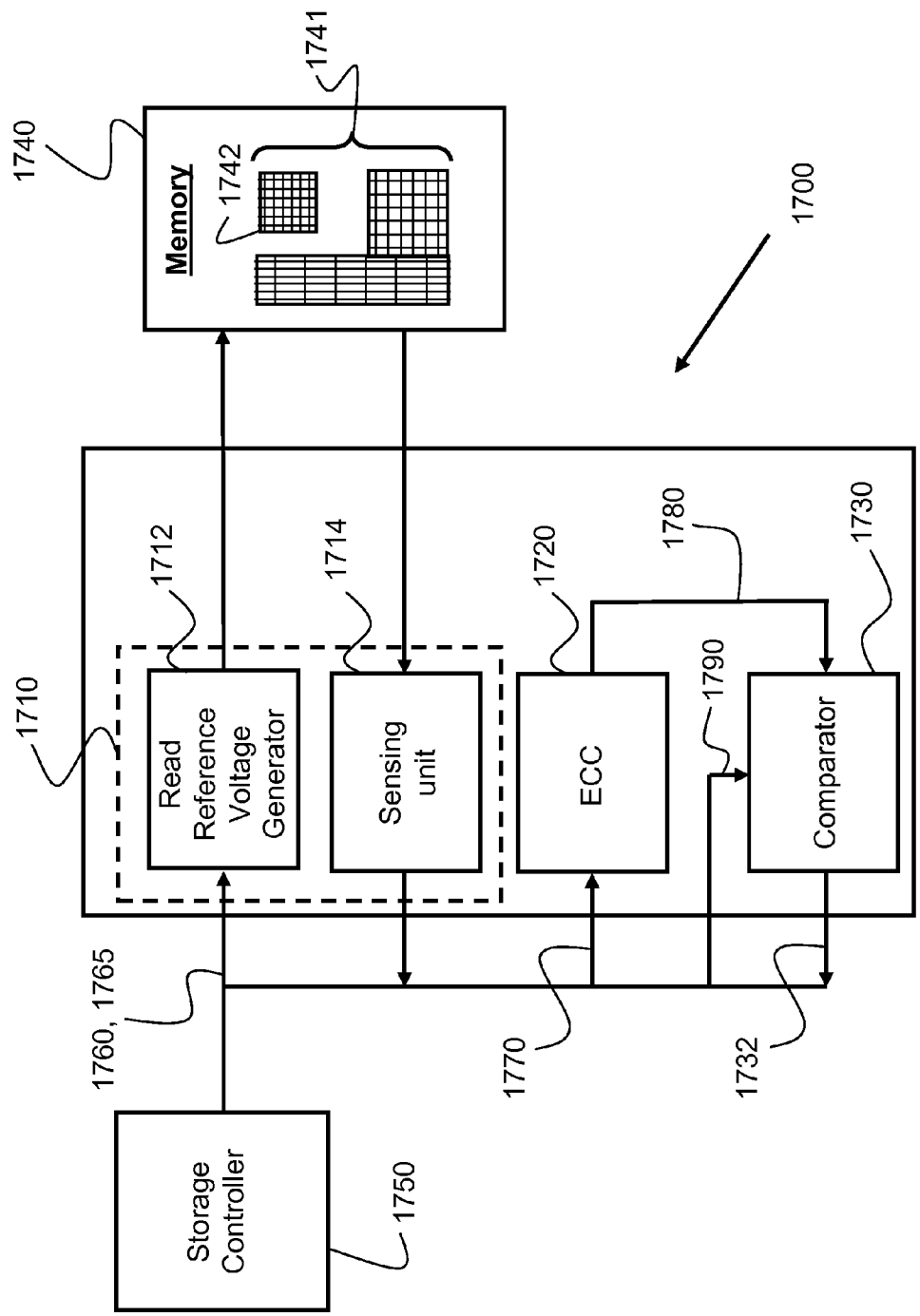
FIG. 17 is a block diagram of a bad bits counting unit according to an example embodiment.

A bad bits counting unit 1440 and its operation, e.g. with storage controller 1420, will be described in terms of bad bit counting unit 1700 and storage controller 1750 of FIG. 17. FIG. 17 is a block diagram of an exemplary bad bits counting unit 1700. Bad bits counting unit 1700 includes a data reading unit 1710, an ECC module 1720, and a comparator 1730. Data reading unit 1710 includes a read reference voltage generator 1712 and a sensing unit 1714. Storage controller 1750 may allocate (at least temporarily) in memory 1740 a group of M charge-storing memory cells 1742, from among the plurality of memory cells 1741, for time estimations and/or cells' wear estimations, or it may select a group of M memory cells for such estimations based on whether the cells hold suitable regular data. (Note: as discussed with reference to FIG. 11, the relative amounts of memory cells 1742 selected for use in making time/wear estimations and memory cells 1741 are not drawn to scale.)

Storage controller 1750 uses bad bits counting unit 1700 to estimate elapsed times (or other discharge related quantities) in the way described below. Storage controller 1750 uses data reading unit 1710 to read the data that is currently stored in selected memory cells 1742. In order to read the data held in memory cells 1742, storage controller 1750 sends 1760 a command to read reference voltage generator 1712 to generate one or more read reference voltages in order to detect the current threshold voltage of each of memory cells 1742. The one or more read reference voltages are applied, one read reference voltage at a time, to the floating gates of the memory cells 1742, and sensing unit 1714 senses the resulting drain currents that flow through the memory cells 1742. Based on the drain currents of memory cells 1742, storage controller 1750 determines if a memory cell is conducting (i.e., the memory cell is "ON") or not (i.e., the memory cell is "OFF"). Storage controller 1750 instructs 1765 read reference voltage generator 1712 to elevate the read reference voltage applied to the cells one step at a time, and at each step senses the resulting current flowing through the cells. If a particular read reference voltage is applied to a memory cell and the memory cell does not transition to the "ON" state, storage controller 1750 instructs read reference voltage generator 1712 to elevate the read reference voltage to the next level. The read reference voltage that causes a memory cell to transition to the "ON" state indicates the binary state of that memory cell. In this way, storage controller 1750 detects the current binary state of each of the memory cells 1742.

After storage controller 1750 reads the data currently stored in memory cells 1742, storage controller 1750 sends 1770 the currently stored data to ECC 1720. ECC 1720 recovers the data and forwards 1780 the recovered data to comparator 1730. Storage controller 1750 forwards 1790 the read data (i.e., the unrecovered data) to comparator 1730 and comparator 1730 compares the two types of data (i.e., the recovered data and the unrecovered data, i.e. the read data which is a corrupted version of the original data) and identifies bit-wise changes in the data. Then, storage controller 1750 receives 1732 the bit-wise changes and counts the total number of bad bits in the (unrecovered) data. Storage controller 1750 then uses an algorithm, a conversion table, a function or some other mechanism (e.g., value-to-time converter 1450 of FIG. 14) to convert the bad bits count to an elapsed time period or to a cells' wear level, or other cell-discharge related quantity, as discussed above. It does not matter which specific memory cell contains bad bit(s): only the total number of the bad bits is taken into account. As explained above, the number of bad bits in the data is correlated with the number of changes of binary state of the memory cells. Therefore, elapsed time periods, cells wear level, or other cell-discharge related quantities may be estimated by using either methodology; i.e., a binary state distribution or a bad bit count.

Figure 18:
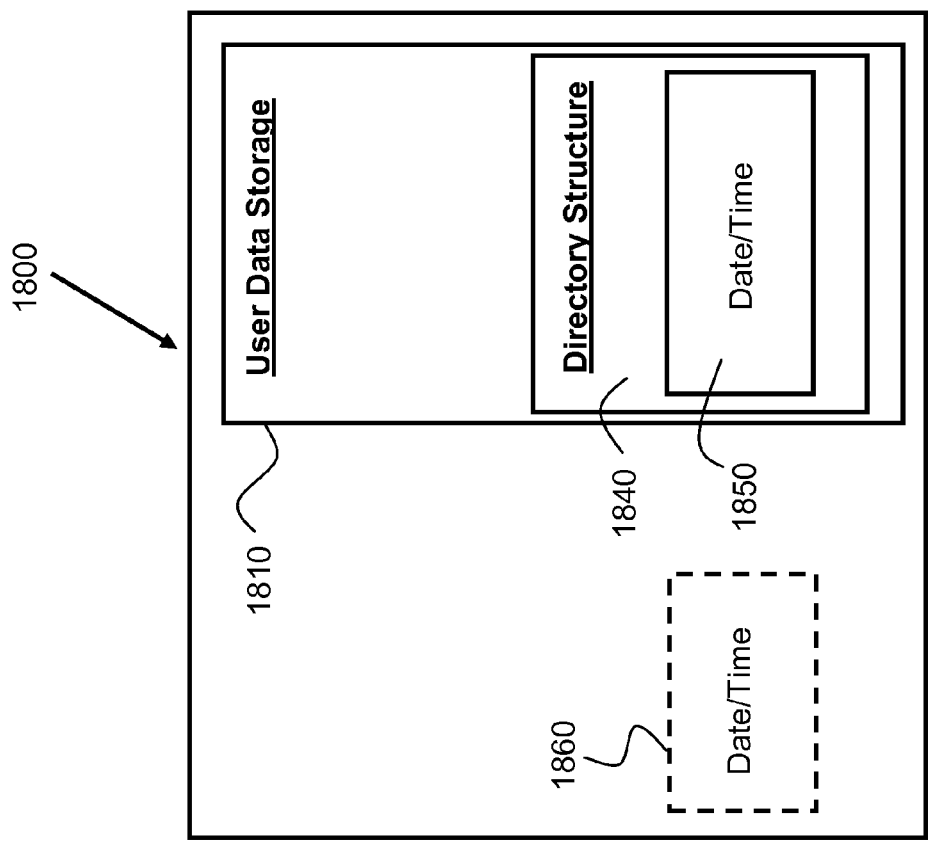
FIG. 18 shows stored date/time information.

With reference to FIG. 18, the storing of date/time information mentioned in connection with FIG. 12 (i.e., at step 1220) and FIG. 15 (i.e., at step 1520) can be performed by storing the date/time information in a directory structure such as directory structure 1840 of user data storage 1810 of storage device 1800 (the date/time information is shown at 1850), or elsewhere, as shown at 1860. For the sake of simplicity, FIG. 18 shows only selected components of a storage device.

Figure 19:
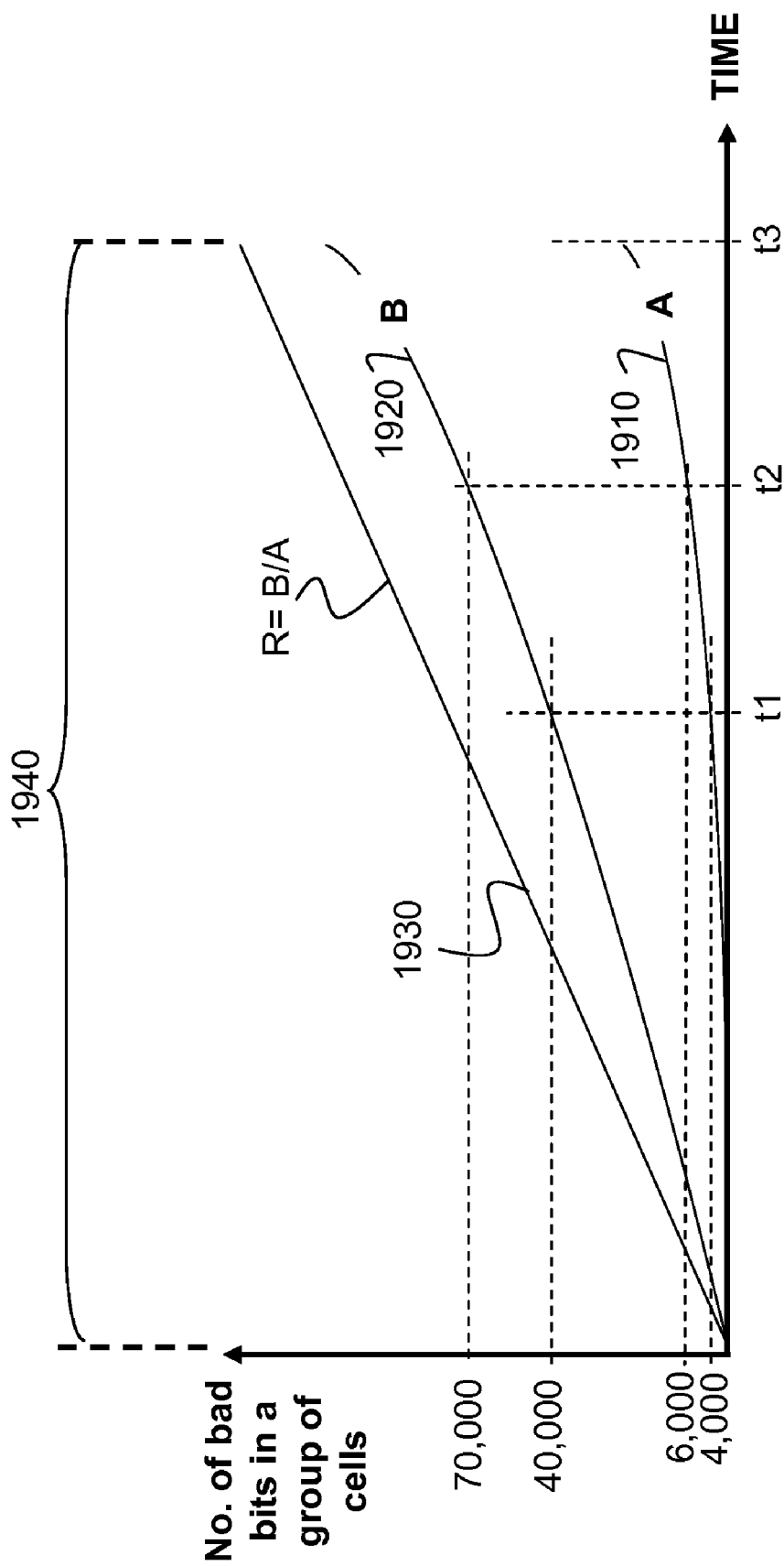
FIG. 19 is a graph showing accumulation of bad cells/bits in two groups of charge-storing memory cells.

FIG. 19 demonstrates self-discharge behavior of two groups of cells that have different self-discharge characteristics. Curve 1910 refers to a group A of fresh memory cells. By "fresh" is meant not worn at all or slightly worn. Curve 1920 refers to a group B of memory cells that are more worn than the memory cells of group A. Curve 1910 and curve 1920 respectively show changes in the total number of bad bits in groups A and B over time. The number of bad bits in group A increases at a slower rate relative to the number of bad bits in group B, and line 1930 shows the ratio R of curve 1920 to curve 1910. By way of example, at time t1 R equals 10 (R=B/A=40,000/4,000) and at time t2 R equals 11.67 (R=B/A=70,000/6,000). Because ratio line 1930 increases monotonically over time, it can be used to calculate elapsed times (i.e., Time=$f(R)$). The exact function Time=$f(R)$ depends on the extent to which the memory cells of group B are more worn than the memory cells of group A, but the function always increases monotonically.

Figure 20:
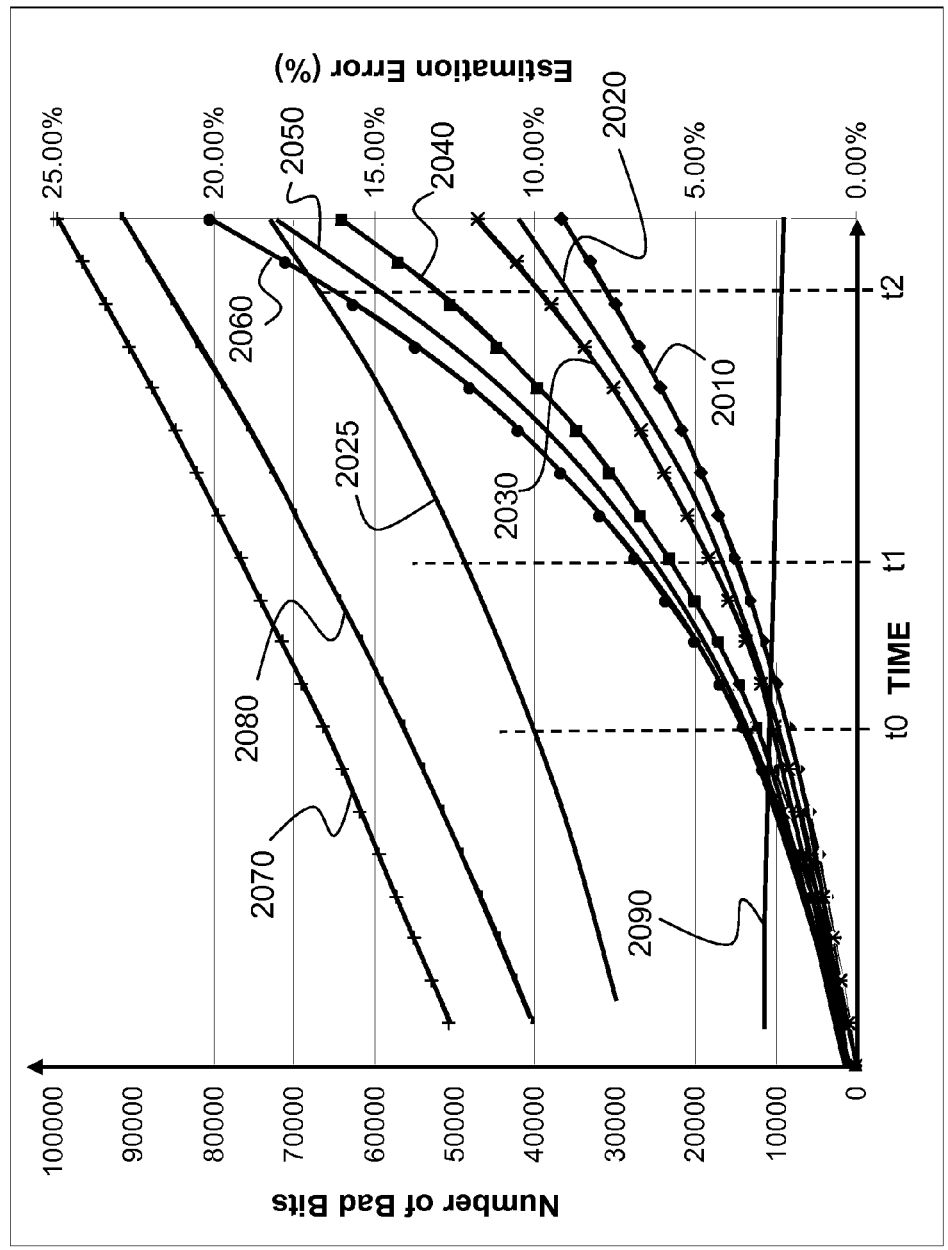
FIG. 20 is a graph showing the effect of temperature on the accumulation of bad bits in two groups of charge-storing memory cells.

The inventor of the present invention has found that a ratio line, such as ratio line 1930, changes only slightly with temperature. This phenomenon is due to the fact that both groups of memory cells are subject to, and affected by, temperature to relatively the same degree. In other words, the ratio R of bad bits in two groups of memory cells is only loosely temperature-dependent because, during a given time period, an increase in temperature increases the total number of bad bits in both groups of memory cells in a similar way. FIG. 20, which is described below, demonstrates the negligible effect of temperature on the ratio R. Using only one group of memory cells may result in significant error in the estimated elapsed times because the number of bad bits in a group of memory cells is very much affected by temperature. However, as demonstrated by FIG. 20, using a ratio of bad bits in two groups of memory cells instead of using the absolute number of bad bits in a single group of cells largely cancels out that effect.

As explained above, for example in connection with FIG. 9, each memory cell eventually loses all or most of its electric charge. This means that, regardless of how much a group of memory cells is worn, all the bits of the group's cells will eventually (i.e., after a very long time) be bad bits. Therefore, assuming that two groups have the same number of memory cells, the value of R for the two groups would eventually be 1.0, or close to 1.0. Nevertheless, the ratio (R) curve has an increasing segment, a portion of which is shown at 1940, and which is usable for estimations of time and other discharge-related values. The usable segment in the ratio curve R typically corresponds to a time period of up to several months. Although not shown in FIG. 19, the ratio curve R increases further beyond time t3, and, at some later point in time, its value decreases until it equals 1.0, or approximately 1.0, and it effectively stays constant thereafter.

FIG. 20 shows comparative simulation graphs that demonstrate the accumulation of bad bits of two, differently worn, groups of memory cells at different temperatures (i.e., at a low temperature, at a medium temperature, and at a high temperature). Curves 2010, 2020, and 2030 represent accumulation of bad bits in a group of fresh (i.e., non-worn or slightly worn) memory cells at different temperatures: curve 2010 represents accumulation of bad bits in the group at a relatively low temperature (i.e., temperature<<25° C., e.g., Temp.=5° C.); curve 2020 represents accumulation of bad bits in the group at a medium temperature (i.e., the temp. is at or around 25° C., e.g., Temp.=22° C., or Temp.=27° C.); and curve 2030 represents accumulation of bad bits in the group at a relatively high temperature (Temp.>>25° C., e.g., Temp.=50° C.).

Curves 2040, 2050, and 2060 represent accumulation of bad bits in a group of worn memory cells at different temperatures: curve 2040 represents accumulation of bad bits in the group at a relatively low temperature (Temp.<<25° C., e.g., Temp.=5° C.); curve 2050 represents accumulation of bad bits in the group at a medium temperature (the temp. is at or around 25° C.); and curve 2060 represents accumulation of bad bits in the group at a relatively high temperature (Temp.>>25° C., e.g., Temp.=50° C.). As stated above, using only one group of memory cells to estimate elapsed times may result in relatively large "time errors". For example, estimating elapsed times by using only the group of fresh memory cells results in error curve 2070. A "time error" at a given point in time is the difference between the actual (i.e., real) time that has elapsed up to that point in time and the time period that is estimated to have elapsed up to that point in time. An error curve is, therefore, a collection of time errors along the time axis. Likewise, estimating elapsed times by using only the group of worn memory cells results in error curve 2080. As error curve 2070 shows, the time estimation error for the group of fresh memory cells is large, as it increases, over time, from about 12.50% to about 25%. As error curve 2080 shows, the time estimation error for the group of worn memory cells is also large, as it increases from about 10.0% to about 23%. If the variable used to estimate time periods is the ratio R of associated numbers of bad bits, then the error is significantly smaller, as demonstrated by error curve 2090. The ratio R of bad bits in the two groups of memory cells is shown in FIG. 20 at 2025. (Note: the ratio R, which is shown at 2025, does not pertain to any particular temperature or temperature range because, as the inventor has found, R is not significantly sensitive to temperature.) As opposed to error curves 2070 and 2080, error curve 2090 does not change much (i.e., the error in this case slightly, or moderately, changes about 2.5%). (Note: the y axis on the left side applies to curves 2010, 2020, 2030, 2040, 2050, and 2060; the y axis on the right side applies to curves 2070, 2080 and 2090.)

FIG. 20 also shows the effect of wear on memory cells. Even though the group of fresh memory cells and the group of worn memory cells are subject to the same low temperature (see lines 2010 and 2040, respectively), the total number of bad bits in the group of fresh cells increases moderately over time, as line 2010 demonstrates, whereas the total number of bad bits in the group of worn cells increases at a much faster pace, as line 2040 demonstrates. The same phenomenon is demonstrated by lines 2020 and 2050 with respect to the medium temperatures range, and by lines 2030 and 2060 with respect to the high temperatures range. As stated above, the ratio R of the number of bad bits in the two groups of memory cells is significantly less dependent on temperature than the number of bad bits in either group. The negligible effect of temperature on the bad bit ratio R is shown below by using numerical examples.

Bad Bits Count for Different Temperatures at Time t0

With continued reference to FIG. 20, at time t0, the number of bad bits in the group of fresh memory cells at a low temperature is about 8,000, and the number of bad bits in the group of worn memory cells at the low temperature is about 11,000. Therefore, at time t0, the ratio (R) of bad bits at the low temperature (that ratio is referred to herein as the "low-temperature ratio") is R=11,000/8,000=1.37. Likewise, at time t0, the number of bad bits in the group of fresh memory cells at a medium temperature is about 10,000, and the number of bad bits in the group of worn memory cells at the medium temperature is about 13,500. Therefore, at time t0, the ratio of bad bits at the medium temperature (that ratio is referred to herein as the "medium-temperature ratio") is R=13,500/10,000=1.35. Likewise, at time t0, the number of bad bits in the group of fresh memory cells at a high temperature is about 10,500, and the number of bad bits in the group of worn cells at the high temperature is about 14,300. Therefore, at time t0, the ratio of bad bits at the high temperature (that ratio is referred to herein as the "high-temperature ratio") is 14,300/10,500=1.36. The ratio values calculated above with respect to time t0 (i.e., the low-temperature ratio R=1.37, the medium-temperature ratio R=1.35, and the high-temperature ratio R=1.36) show that the effect of temperature on the ratio of bad cells at time t0 is negligible.

Bad Bits Count for Different Temperatures at Time t1

At time t1, the low-temperature ratio is R=23,000/15,000=1.53; the medium-temperature ratio is R=26,000/17,000=1.52; and high-temperature ratio is 28,000/18,000=1.55. The ratio values calculated above with respect to time t1 show that the effect of temperature on the ratio of bad cells at time t1 is also negligible.

Bad Bits Count for Different Temperatures at Time t2

At time t2, low-temperature ratio of the bad bits is R=52,000/31,000=1.68; the medium-temperature ratio is R=59,000/36,000=1.64; and the high-temperature ratio is R=64,000/39,000=1.64. The ratio values calculated above with respect to time t2 show that the effect of temperature on the ratio of bad cells at time t2 is also negligible. The memory cells of the various cell groups that are used to estimate elapsed times are manufactured on a substrate, which, typically, is the substrate onto which the other charge-storing memory cells of the storage device are built. Therefore, the cell groups are all subject to the same temperature effect and, as demonstrated in FIG. 20, the effect of temperature on the ratio R of bad bits is negligible.

Figure 21:
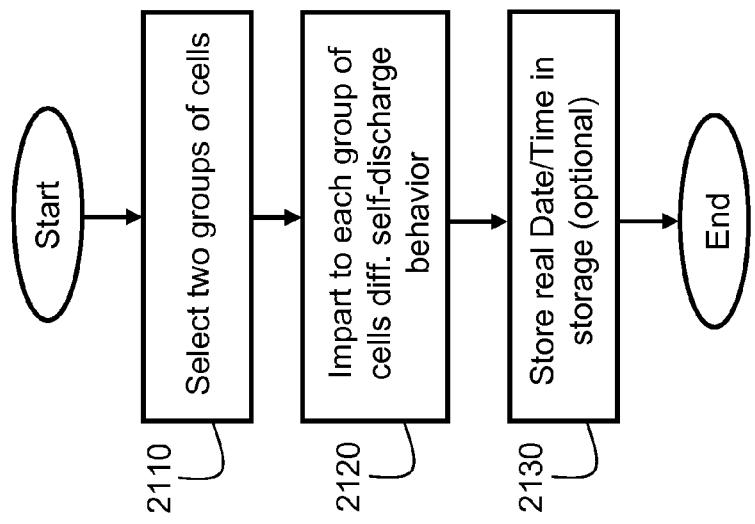
FIG. 21 is a method for preparing a storage device for estimating elapsed time periods and cells' wear according to another example embodiment.

FIG. 21 is a method for preparing a storage device for estimating elapsed time periods and cells' wear according to another example embodiment. At step 2110, a storage controller (e.g., storage controller 1120 of FIG. 11 or storage controller 1420 of FIG. 14) selects, from a plurality of memory cells of the storage device, two groups of memory cells and, at step 2120 the controller imparts to each group of memory cells a different self-discharge behavior, for example, by wearing only one of the groups of memory cells, or by wearing one group of memory cells more or less than the other. The storage controller, then, uses the differently worn groups of memory cells to determine elapsed time periods, as discussed above. Since two groups of memory cells having different self-discharge behavior are used, the changes in temperature do not cause large errors in the measurement of elapsed time.

Step 2110 may also include a stage in which the storage controller initially stores a maximum charge value in each group of cells, as described, for example, in connection with FIG. 12 (step 1220). Alternatively, the storage controller may select the memory cells for each group based on the data (e.g., user data) that the memory cells contain, as explained, for example, in connection with FIGS. 14 through 16. Then, at step 2120, the storage controller wears the memory cells of one group to impart to it a self-discharge behavior different from that of the other group. At step 2130, an optional step, the storage controller may store real date/time information. The storage controller may update the real date/time information if any of the conditions described above is satisfied, for example after the storage controller resets the timekeeping mechanism.

Figure 22:
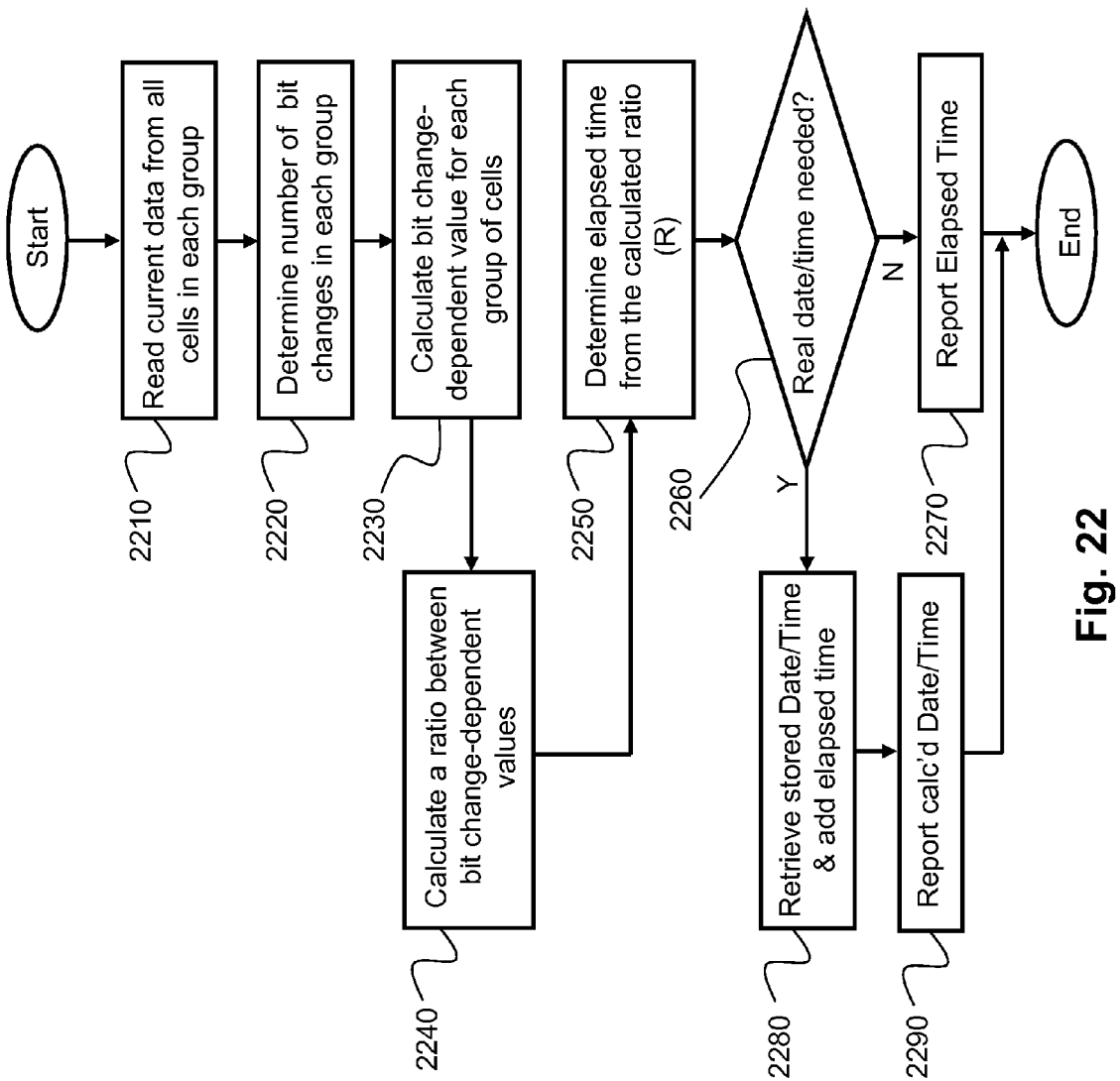
FIG. 22 is a method for estimating elapsed time periods according to another example embodiment.

FIG. 22 is an exemplary method for estimating elapsed time periods. FIG. 22 will be described in association with FIG. 21 (the method of FIG. 21 may be deemed a part of the method of FIG. 22). At step 2210, a storage controller (e.g., storage controller 1120 of FIG. 11 or storage controller 1420 of FIG. 14) reads the current data from all the memory cells in each group, and, at step 2220, the storage controller determines the number of bad bits (bit changes) in each group of cells. The storage controller may determine the number of bad bits in each group of cells either by reading the current binary states of the group's memory cells (as described, for example, in connection with FIGS. 11 through 13), or by using an error correction mechanism (as described, for example, in connection with FIGS. 14 through 16).

At step 2230, the storage controller calculates a bit change-dependent value for each group of memory cells by calculating the state weights for that group and, thereafter, by summing up the state weights (as per steps 1320 and 1330 of FIG. 13). Alternatively, the bit change-dependent value of the particular group of memory cells may be the total number of bad bits in the group, which may be calculated by using ECC (as per steps 1620 and 1630 of FIG. 16).

Assuming that two groups of memory cells are used to estimate elapsed time—one group of fresh memory cells and one group of worn memory cells—a first bit change-dependent value (V1) is obtained at step 2230 for the group of fresh cells and a second bit change-dependent value (V2) is obtained, also at step 2230, for the group of worn cells. At step 2240, the storage controller calculates a ratio R of the two values (i.e., R=V2/V1) and, at step 2250, it converts the calculated ratio R to an elapsed time period. The conversion of the ratio R to elapsed time (or other discharge related value) may be based on a function analogous to the function employed to convert state-weighted sum to time, such as that shown graphically in FIG. 7D discussed above, but where $\nabla_{DISCHARGE}$ is replaced by R, mutatis mutandis (e.g., the value of R increases over time). A conversion table or algorithm may be employed. Steps 2260 though 2290 are respectively identical to steps 1350 through 1380 of FIG. 13 and to steps 1650 through 1680 of FIG. 16. By using a ratio R of values that represent different groups of memory cells, as opposed to using a value that represents one group of memory cells, changes in temperature over the course of the elapsed time have little effect on the values obtained for the elapsed times.

In general, n groups of memory cells are permitted to self-discharge and, for each particular group of memory cells, the storage controller determines, at a particular time during the self-discharge of the memory cells, a value (e.g., number of bit changes, i.e., of bad bits, or a bit-change dependent value) that is related to the discharge of the particular group of memory cells. The storage controller may determine the value by (i) detecting a current binary state of the memory cells of the group relative to their respective initially programmed binary states (e.g., as per step 2210 of FIG. 22); (ii) determining a number of bit changes in the memory cells of the group relative to their respective initially programmed binary states (e.g. as per step 2220 of FIG. 22); and (iii) calculating a value that represents the current state of the group (e.g., as per step 2230 of FIG. 22). Then, the storage controller may convert the values respectively calculated for the n groups, or ratios between values (e.g., as per step 2240 of FIG. 22, as explained further below), to a discharge-determining condition (e.g., as per step 2250 of FIG. 22), such as elapsed time or cell wear (e.g. corresponding to a number of write/erase cycles of the memory cells). Put otherwise, converting the calculated values to the discharge-determining condition (e.g., elapsed time) is performed by using a ratio between respective values of binary state distributions of two of the n groups.

It is to be noted that temperature may also be deemed a discharge-determining condition. Given two factors among time, temperature, and wear, the third factor, or its effect on memory cells, can be estimated. For example, if an elapsed time and an expected cells' wear are known, it is possible to estimate the (average) temperature to which the memory cells were exposed, as shown, for example, in FIG. 23, which is described below.

First, referencing again FIG. 6B, if, for example, elapsed times are estimated by using three groups (n=3) of memory cells, then a current bit-changed dependent value Di (i=1, 2, 3) is calculated for each group; that is, a current bit-changed dependent value D1 is calculated for a first group; a current bit-changed dependent value D2 is calculated for a second group; and a current bit-changed dependent value D3 is calculated for a third group. Several ratios may be calculated; e.g., R1=D1/D2; R2=D1/D3; and R3=D2/D3. Then, the ratios may be averaged and the resulting average ratio $\overline{R}$ may be converted to an elapsed time or to cells wear level by using a conversion function, a conversion table, or a conversion algorithm. The conversion of the average ratio $\overline{R}$ to elapsed time (or other discharge related value) may be based on a function analogous to the function employed to convert state-weight to time, such as that shown graphically in FIG. 7D discussed above, but where $\nabla_{DISCHARGE}$ is replaced by $\overline{R}$, mutatis mutandis (e.g., the value of $\overline{R}$ increases over time). A conversion table or algorithm may be employed.

The average ratio $\overline{R}$ may be calculated as follows:

$$\overline{R} = \frac{R1 + R2 + R3}{3}$$

If elapsed times or cells wear levels are estimated by using n groups of memory cells and the number of calculated ratios is l, then the average ratio $\overline{R}$ is calculated using formula (4):

$$\overline{R} = \frac{1}{l}\sum_{i=1}^{l} R_i \qquad (4)$$

Alternatively, instead of the average ratio $\overline{R}$, a highest or lowest ratio (i.e. the ratio having the largest or smallest numerical value, respectively) may be used. In the above example, the highest ratio would be the ratio from among R1, R2, and R3 having the greatest value, and the lowest ratio would be the ratio from among R1, R2, and R3 having the smallest value.

Figure 23:
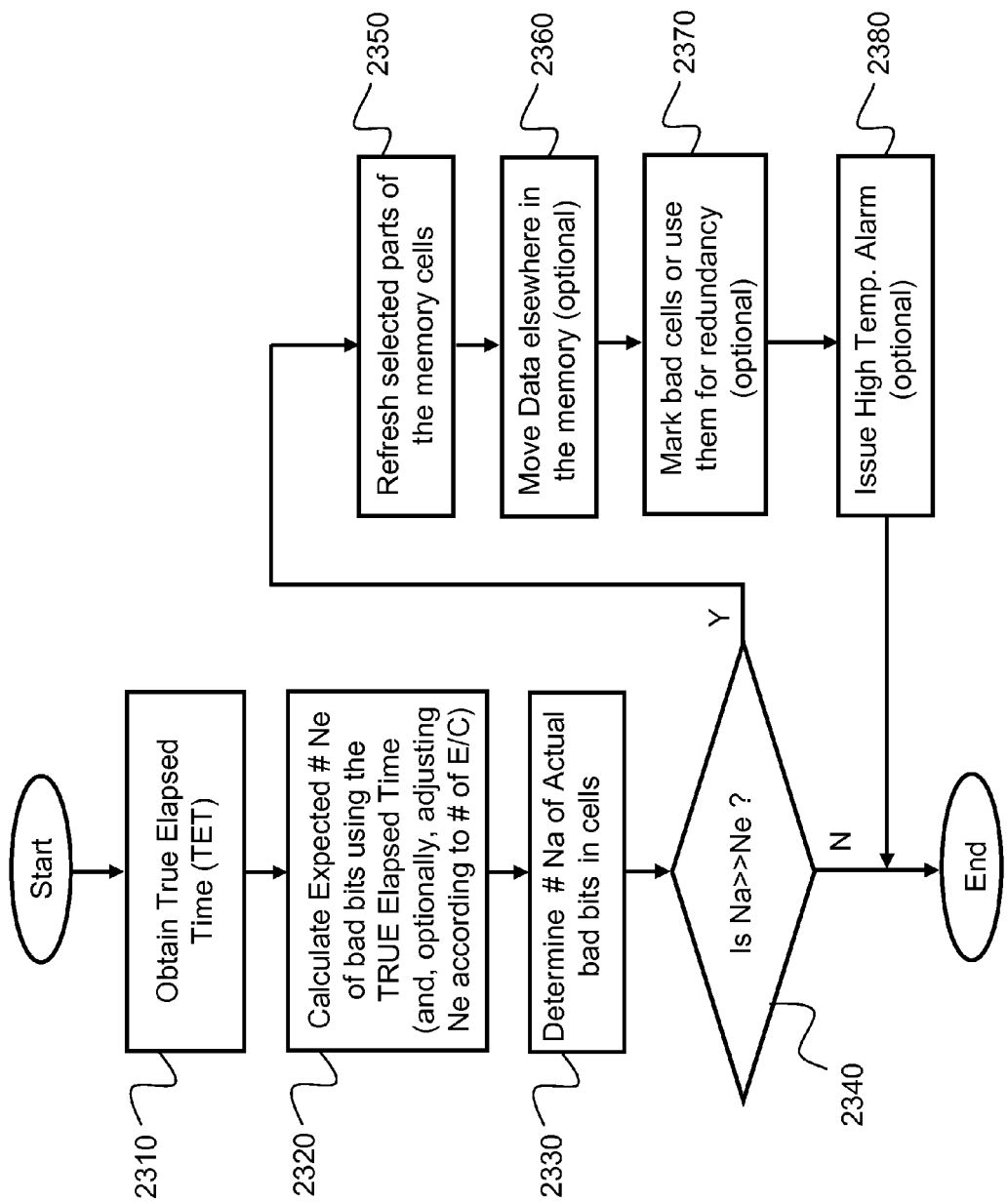
FIG. 23 is a method for estimating a temperature range, or temperatures changes, to which memory cells were exposed, according to an example embodiments.

Now, we turn to FIG. 23. FIG. 23 is a method for estimating a temperature range, or temperatures changes, to which memory cells were exposed according to an example embodiment. Given a precise time period that elapsed from the time at which maximum charge value or user data was set/programmed into memory cells, and assuming that the memory cells have been subject to normal temperatures (e.g., between 20° C. and 25° C.), the wear level of memory cells can be anticipated; i.e., the memory cells' are expected to wear "normally" if they are continuously exposed to normal temperatures. FIG. 23 is a method that determines temperature changes by determining whether memory cells, on the average, wear "normally", i.e., as expected, or faster than expected.

A determination whether the memory cells wear at an expected (i.e., normal) average wear rate or faster is based on the current state of the memory cells. Assuming that the memory cells are subject to normal temperatures, they are expected to have a certain number of bad bits after a certain time has elapsed. Therefore, the wear level of the memory cells can be evaluated, for example, by comparing an actual number of bad bits in the group of memory cells to an expected number of bad bits: an actual number of bad bits that is much greater than the expected number of bad bits would imply that the memory cells were exposed to high temperatures (i.e., temperatures much greater than 25° C.; e.g., between 38° C. and 55° C.). Therefore, if, based on such a comparison, the storage controller of a storage device concludes that the storage device containing the memory cells was exposed to excess temperatures; it would be worthwhile to take actions in order to prevent data loss when the storage device is reconnected to a host. Such actions may include, for example, requesting the user of the storage device to protect the storage device from excess temperatures and/or to refresh selected data.

With continued reference to FIG. 23, at step 2310, the storage controller obtains a true elapsed time, i.e. not an estimated elapsed time using the methods described hereinabove. Regarding the true elapsed time, the storage device containing the memory cells internally stores the date/time at which the memory cells are initially charged with the initial data (that date/time is referred to herein as an "initial date/time"). The storage device may receive the initial date/time from its host. At a future point in time, the storage device, while operating with a host, receives a current date/time from the host. The host with which the storage device operates can be the host that provided the initial date/time to the storage device, or another host whose date/time information can be trusted. The storage device may calculate a precise elapsed time period as the difference between the current date/time and the initial date/time.

As explained above, the change in the number of bad bits from one time (e.g., from time t0) to another (e.g., to time t1, t1>t0) is correlated with the time elapsing from t0 to t1 and can be anticipated for a given known temperature. For example, assuming a particular group of memory cells are maintained continually at 25° C., if the initial number of bad bits in that group at time t0 is, say, 1,000, then, using the aforesaid correlation, the number of bad bits in that group may be anticipated to be, say, 5,500 at time t1, and 15,000 at time t2 (t2>t1>t0). In other words, the relationship between an elapsed time $\Delta T$ and the number of bad bits $N_b$ in a group of memory cells can be determined as a specified function for a given temperature (i.e., $N_b = f(\Delta T)_{|Temp}$) where the given temperature is preferably some normal temperature (e.g., 25° C.±$\Delta$Temp, where $\Delta$Temp is some margin, e.g., 5° C.). As explained above, the elapsed time $\Delta T$ is calculated from the time at which the maximum charge value or user data was initially set to the group of memory cells.

Assuming that such a function has been determined for a temperature of 25° C. (i.e., $N_b = f(\Delta T)_{|25° C.}$) if the memory cells are constantly exposed to a temperature of 25° C., then the actual number of bad bits after an elapsed time $\Delta T$ is expected to be close to the theoretical number $N_b$ of bad bits. Accordingly, at step 2320, the storage controller calculates an expected number Ne of bad bits by using the function $N_b = f(\Delta T)_{|Temp}$ ($\Delta T$, a precise/real elapsed time, is assumed to be known). Optionally, Ne is adjusted according to the number of E/C, discussed below. At step 2330, the storage controller determines the actual number Na of bad bits of the group of memory cells (i.e., Nb=Na at step 2330). Then, at step 2340, the storage controller determines whether Na>>Ne. Na>>Ne implies that the pertinent memory cells were subject to temperatures higher than the temperature or temperature range for which the function $N_b = f(\Delta T)_{|Temp}$ was determined. Given the predictability of bad bits accumulation and the number of memory cells ($10^5$ or more) per group, Na can be regarded as being much greater than (i.e., >>) Ne if it is at least approximately 1.2 times larger than Ne. By selecting 1.2 as the minimal decision limit, the probability that Na is due solely to normal conditions (e.g., exposure of the cells to normal temperatures) is understood to be less than 5% (i.e., the probability that Na is due also to abnormal conditions, e.g., high temperatures, is more than 95%). For example, if the function $N_b = f(\Delta T)_{|Temp}$ was determined for 25° C. and the number of bad bits is expected (i.e., based on the function $N_b = f(\Delta T)_{|25° C.}$) to be, say, 5,700 for $\Delta T$=5 months, then, if, after 5 months the actual number Na of bad bits is, say, greater than 6,840 (e.g., 8,000), it implies that the pertinent memory cells were subject to temperatures much higher than 25° C. (e.g., greater than 50° C., which means that the cells were wearing faster than expected. Continuing the example above, if the actual number Na of bad bits is less than 6,840, say, 6,000, it implies that the pertinent memory cells were subject to temperatures at or about 25° C. (e.g., 27° C.), and that the cells were wearing as expected (i.e., normally).

If the condition Na>>Ne is not met (shown as "N" at step 2340); i.e., Na>Ne, or Na=Ne, or Na<Ne (Na may sometimes be smaller than Ne because Na is an actual number of bad bits and Ne is a theoretical number of bad bits), this means that the memory cells are wearing normally (i.e., as expected for the temperature for which the function $N_b = f(\Delta T)_{|Temp}$ was determined) and no intervention is required from the storage controller further to performing already planned tasks that are associated, for example, with wear leveling, general housekeeping, etc. The states Na>Ne, Na=Ne, and Na<Ne are associated with normal average cells' wear because a zero difference (i.e., $\Delta N$=0, where $\Delta N$=|Na−Ne|) means that the actual number of bad bits is exactly as expected, and a small difference $\Delta N$ practically implies only an insignificant deviation from the expected number.

If Na>>Ne (shown as "Y" at step 2340), this means that the memory cells have worn faster than expected. If memory cells wear faster than expected, this usually indicates that the memory cells were subject to high temperatures. Therefore, at step 2350, the storage controller may initiate an unplanned activation of a data-refresh procedure in order to selectively refresh parts of the memory cells in order to prevent data loss. The storage controller may determine to refresh specific memory cells either because they belong to a particular group of memory cells, or because these memory cells hold critical data or important data. The data stored in these memory cells may be critical or important, for example, if it includes boot code, security information, authentication information, etc.

Further, at step 2360 (an optional step), the storage device may decide to move data from one part of the memory to another part of the memory, and/or, at step 2370 (another optional step), it may mark problematic memory cells as bad cells or use these memory cells for redundancy, and/or, at step 2380 (yet another optional step), it may issue a "High Temp." alarm message and transfer it to the storage device's host in order for it to be communicated to the user of the storage device, e.g. visually or audibly. Note that the case of Na<<Ne (the number of actual bad bits is much less than normal/expected number of bad bits) is not expected to occur.

Returning to step 2320, as demonstrated in FIG. 20, the number of bad bits in a group of memory cells is also affected by the wear level of the memory cells, i.e. worn memory cells accumulate a much larger number of bad bits than fresh memory cells over a given period of time. Therefore, the (theoretical) number Ne of expected bad bits that is calculated at step 2320 may be adjusted according to, e.g., the number of write/erase cycles applied to the memory cells. (Other measures of wear are possible.) The greater the number of write/ erase cycles applied to memory cells, the higher the number Ne associated with these memory cells. The storage controller can, therefore, store, e.g. the number of write/erase cycles (E/C) performed on the memory cells at the same time that it programs the initial data into the memory cells and later (as part of step 2320), when the storage device is reconnected to a host, use that number (i.e., E/C) to adjust the number Ne. For example, if Ne=25,000 and the number of write/erase cycles is, say, E/C=45, then the adjusted value of Ne (i.e., Ne') may be Ne'=25,800 (for example). Continuing the example, if the number of write/erase cycles is, say, E/C=2, then Ne may be, after the adjustment, Ne'=24,850. The adjustment of Ne depends on how the function $N_b=f(\Delta T)_{|Temp}$ was determined; i.e., on which parameters were taken into account. For example, the function $N_b=f(\Delta T)_{|Temp}$ may be determined by taking into account a normal temperature range (e.g., between 20° C. and 25° C.) and, for example, five write/erase cycles (i.e., E/C=5). If the actual number of write/erase cycles that a storage device undergoes is greater than that number (i.e. five), then Ne may be adjusted according to the difference: the greater the difference ($\Delta E$) between the number of write/erase cycles taken into account in determining the function and the actual number of write/erase cycles, the greater the adjustment of Ne would be.

Figure 24:
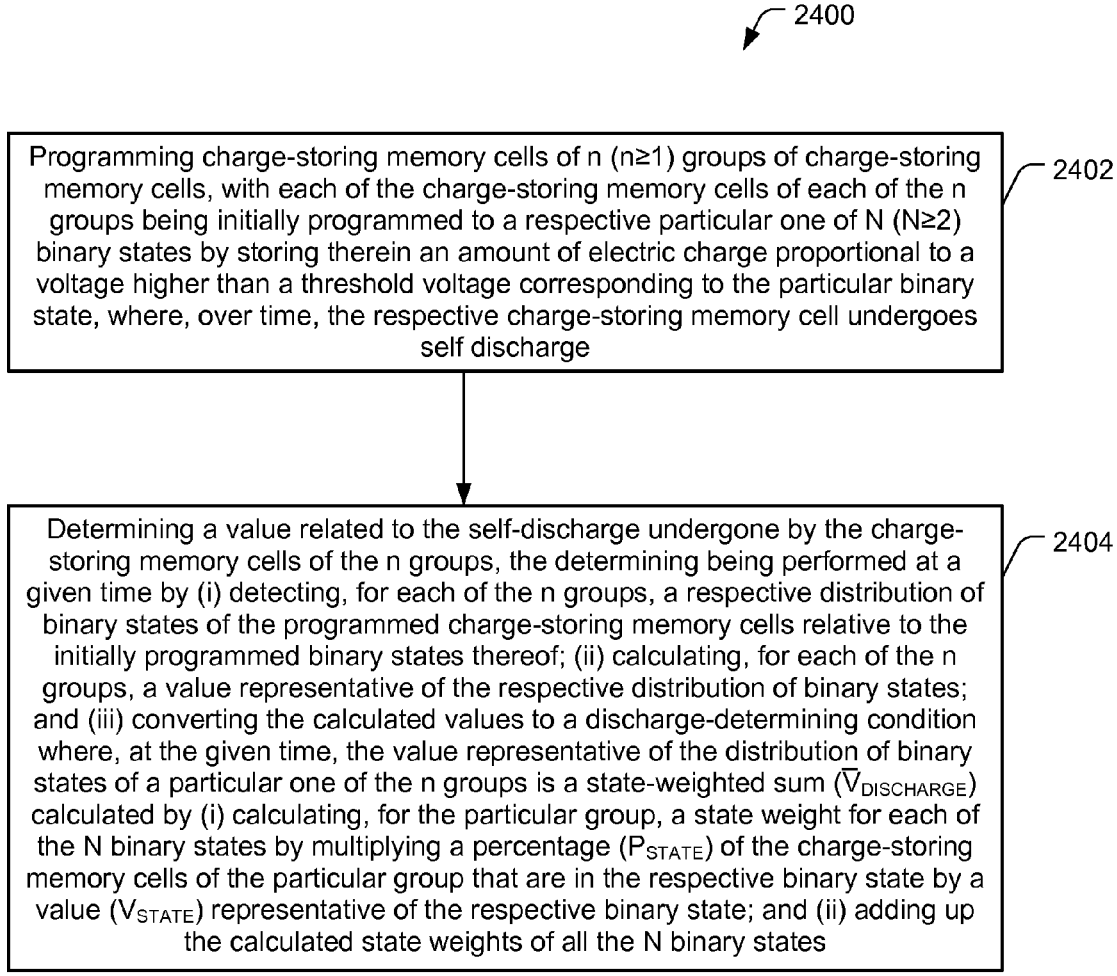
FIG. 24 is a flow diagram of an embodiment of a method of determining values related to discharge of charge-storing memory cells in a storage device.

FIG. 24 is a flow diagram of an embodiment of a method of determining values related to discharge of charge-storing memory cells in a storage device and is generally designated 2400. The method includes programming charge-storing memory cells of n groups of charge-storing memory cells, with each of the charge-storing memory cells of each of the n groups being initially programmed to a respective particular one of N (N≧2) binary states by storing therein an amount of electric charge proportional to a voltage higher than a threshold voltage corresponding to the particular binary state, where, over time, the respective charge-storing memory cell undergoes self discharge, at 2402.

The method further includes determining a value related to the self-discharge undergone by the charge-storing memory cells of the n groups, the determining being performed at a given time by (i) detecting, for each of the n groups, a respective distribution of binary states of the programmed charge-storing memory cells relative to the initially programmed binary states thereof, (ii) calculating, for each of the n groups, a value representative of the respective distribution of binary states, and (iii) converting the calculated values to a discharge-determining condition, at 2404. At the given time, the value representative of the distribution of binary states of a particular one of the n groups is a state-weighted sum ($\nabla_{DISCHARGE}$) calculated by (i) calculating, for the particular group, a state weight for each of the N binary states by multiplying a percentage ($P_{STATE}$) of the charge-storing memory cells of the particular group that are in the respective binary state by a value ($V_{STATE}$) representative of the respective binary state; and (ii) adding up the calculated state weights of all the N binary states.

Figure 25:
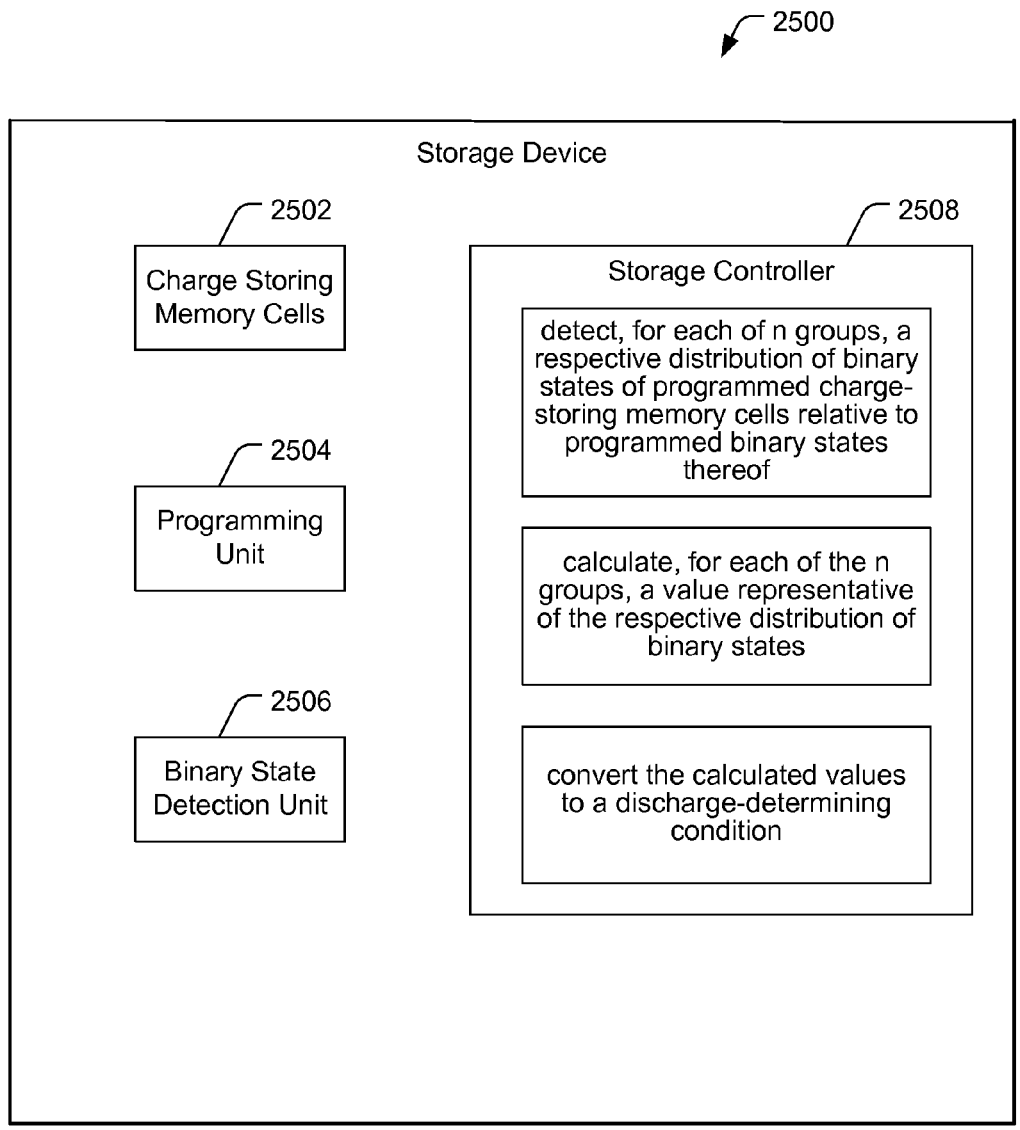
FIG. 25 is a block diagram of an embodiment of a storage device.

FIG. 25 is a block diagram of an embodiment of a storage device 2500. The storage device 2500 includes charge storing memory cells 2502, a programming unit 2504, a binary state detection unit 2506, and a storage controller 2508.

The charge storing memory cells 2502 may include a plurality of charge-storing memory cells including n (n≧1) groups of one or more charge-storing memory cells. The programming unit 2504 may program the charge-storing memory cells of each of the n (n≧1) groups of charge-storing memory cells, where, over time, the charge-storing memory cells of the n groups undergo self discharge. The binary state detection unit 2506 may detect a distribution of binary states of the charge-storing memory cells of each of the n groups.

The storage controller 2508 may manage the plurality of charge-storing memory cells 2502, the programming unit 2504, and the binary state detection unit 2506. The storage controller 2508 may be configured, at a given time, to detect, for each of the n groups, a respective distribution of binary states of the programmed charge-storing memory cells 2502 relative to the programmed binary states thereof. The storage controller 2508 may further be configured, at the given time, to calculate, for each of the n groups, a value representative of the respective distribution of binary states. The storage controller 2508 may further be configured, at the given time, to convert the calculated values to a discharge-determining condition.

The articles "a" and "an" are used herein to refer to one or to more than one (i.e., to at least one) of the grammatical object of the article, depending on the context. By way of example, depending on the context, "an element" can mean one element or more than one element. The term "including" is used herein to mean, and is used interchangeably with, the phrase "including but not limited to". The terms "or" and "and" are used herein to mean, and are used interchangeably with, the term "and/or," unless context clearly indicates otherwise. The term "such as" is used herein to mean, and is used interchangeably, with the phrase "such as but not limited to".

Having thus described exemplary embodiments of the invention, it will be apparent to those skilled in the art that modifications of the disclosed embodiments will be within the scope of the invention. Alternative embodiments may, accordingly, include more modules, fewer modules and/or functionally equivalent modules. The present disclosure is relevant to various types of mass storage devices such as SD-driven flash memory cards, flash storage devices, "Disk-on-Key" devices that are provided with a Universal Serial Bus ("USB") interface, USB Flash Drives (""UFDs"), MultiMedia Cards ("MMCs"), Secure Digital ("SD") cards, miniSD, microSD, Solid State Drives ("SSDs"), and so on. Hence the scope of the claims that follow is not limited by the exemplary embodiments set forth in this disclosure.

What is claimed is:

1. A method of determining values related to discharge of charge-storing memory cells in a storage device, the method comprising:
  in a storage device having a plurality of charge-storing memory cells including n (n≧1) groups of one or more charge-storing memory cells, performing, by a controller of the storage device,
    programming the charge-storing memory cells of the n groups of charge-storing memory cells, with each of the charge-storing memory cells of each of the n groups being initially programmed to a respective particular one of N (N≧2) binary states by storing therein an amount of electric charge proportional to a voltage higher than a threshold voltage corresponding to the particular binary state, whereby, over time, the respective charge-storing memory cell undergoes self discharge;
    determining a value related to the self-discharge undergone by the charge-storing memory cells of the n groups, the determining being performed at a given time by,
      (i) detecting, for each of the n groups, a respective distribution of binary states of the programmed charge-storing memory cells relative to initially programmed binary states thereof;

(ii) calculating, for each of the n groups, a value representative of the respective distribution of binary states to generate calculated values; and (iii) converting the calculated values to a discharge-determining condition.

2. The method as in of claim 1, wherein the discharge-determining condition is an elapsed time.

3. The method of claim 2, wherein converting the calculated values to the elapsed time is performed by using a ratio between respective values of binary state distributions of two of the n groups.

4. The method of claim 2, wherein converting the calculated values to the elapsed time includes calculating ratios between pairs of the calculated values for n>1.

5. The method of claim 4, wherein converting the calculated values includes any one of using an average ratio, using a lowest ratio, and using a highest ratio.

6. The method of claim 1, wherein, at the given time, the value representative of the distribution of binary states of a particular one of the n groups is a state-weighted sum ($\nabla_{DISCHARGE}$) calculated by, (i) calculating, for the particular group, a state weight for each of the N binary states by multiplying a percentage ($P_{STATE}$) of the charge-storing memory cells of the particular group that are in the respective binary state by a value ($V_{STATE}$) representative of the respective binary state to generate calculated state weights; and (ii) adding up the calculated state weights of all the N binary states.

7. The method of claim 6, wherein the value $V_{STATE}$ representative of the respective binary state is an average value of a threshold voltage range associated with the respective binary state.

8. The method of claim 1, wherein initial programmed binary states are selected in such a manner as to store a maximum electric charge in each of the charge-storing memory cells of the n groups.

9. The method of claim 1, wherein all of the charge-storing memory cells of the n groups are initially programmed to a same binary state.

10. The method of claim 1, wherein initially programmed binary states of the charge-storing memory cells of the n groups correspond to any one of user data and predetermined data.

11. The method of claim 1, wherein for each of the n groups of charge-storing memory cells the value representative of the distribution of binary states of a respective group of memory cells is a number of bad bits in the respective group.

12. The method of claim 11, wherein the discharge-determining condition is a wear level or average wear rate, and wherein converting the calculated values to the wear level or average wear rate of the memory cells of the respective group is determined by comparing the number of bad bits to an expected number of bad bits.

13. A storage device comprising:
a plurality of charge-storing memory cells including n (n≧1) groups of one or more charge-storing memory cells;
a programming unit for programming the charge-storing memory cells of each of the n (n≧1) groups of charge-storing memory cells, whereby, over time, the charge-storing memory cells of the n groups undergo self discharge;
a binary state detection unit for detecting a distribution of binary states of the charge-storing memory cells of each of the n groups;
a storage controller for managing the plurality of charge-storing memory cells, the programming unit, and the binary state detection unit,
wherein the storage controller is configured, at a given time,
to detect, for each of the n groups, a respective distribution of binary states of the programmed charge-storing memory cells relative to programmed binary states thereof;
calculating, for each of the n groups, a value representative of the respective distribution of binary states to generate calculated values; and
converting the calculated values to a discharge-determining condition.

14. The storage device of claim 13, wherein the discharge-determining condition is an elapsed time.

15. The storage device of claim 14, wherein the storage controller converts the calculated values to the elapsed time by using a ratio between respective values of binary state distributions of two of the n groups.

16. The storage device of claim 14, wherein, for n>1, the storage controller converts the calculated values to the elapsed time by calculating ratios between pairs of the calculated values, wherein converting the calculated values to the elapsed time includes any one of using an average ratio, using a lowest ratio, and using a highest ratio.

17. The storage device of claim 13, wherein the storage controller initially programs all of the charge-storing memory cells of the n groups to a same binary state.

18. The storage device of claim 13, wherein for each of the n groups of charge-storing memory cells the value representative of the distribution of binary states of a respective group of memory cells is a number of bad bits in the respective group.

19. The storage device of claim 18, further comprising an error correcting code mechanism for detecting the bad bits.

20. The storage device of claim 18, wherein the discharge-determining condition is a wear level or average wear rate, and wherein the storage controller converts the calculated values to the wear level or average wear rate of the memory cells of the respective group based on comparison of the number of bad bits to an expected number of bad bits.

21. The storage device of claim 13, wherein the charge-storing memory cells are memory cells of a flash memory or an EEPROM.

22. A storage device comprising:
a memory comprising a group of memory elements, wherein each memory element of the group is configured to be programmed with a charge to a respective binary state, wherein once programmed, the memory elements of the group undergo self discharge over time; and
a controller configured to:
determine collective changes in the binary states of the memory elements of the group; and
estimate a discharge-determining condition based on the collective changes in the binary states.

23. The storage device of claim 22, wherein the controller is further configured to:
detect a distribution of binary states of the memory elements of the group relative to first programmed binary states thereof; and
generate a calculated value representative of the distribution of binary states;
wherein the discharge-determining condition is based on the calculated value.

24. The storage device of claim 23, further comprising a programming unit configured to program the group of memory elements.

25. The storage device of claim 23, wherein the calculated value includes a state-weighted sum.

26. The storage device of claim 25, wherein the state-weighted sum is calculated by:
- calculating, for the memory elements of the group, a state weight for each of the binary states by multiplying a percentage of the memory elements of the group that are in the respective binary state by an average value of a threshold voltage range associated with the respective binary state to generate calculated state weights; and
- adding up the calculated state weights of all the binary states.

27. The storage device of claim 23, wherein the calculated value includes a number of bad bits in the memory elements of the group, wherein the number of bad bits is compared to an expected number of bad bits and based on the comparison, a wear indication of the memory elements of the group is determined.

28. The storage device of claim 27, further comprising an error correcting code unit configured to detect the bad bits.

29. A method comprising:
- in a storage device comprising a group of memory elements and a controller, wherein each memory element of the group is configured to be programmed with a charge to a respective binary state, and wherein once programmed, the memory elements of the group undergo self discharge over time, performing:
  - determining collective changes in the binary states of the memory elements of the group; and
  - estimating a discharge-determining condition based on the collective changes in the binary states.

30. The method of claim 29, further comprising:
- detecting a distribution of binary states of the memory elements of the group relative to first programmed binary states thereof; and
- generating a calculated value representative of the distribution of binary states;
- wherein the discharge-determining condition is based on the calculated value.

31. The method of claim 30, wherein the calculated value includes a state-weighted sum.

32. The method of claim 31, wherein the state-weighted sum is calculated by:
- calculating, for the memory elements of the group, a state weight for each of the binary states by multiplying a percentage of the memory elements of the group that are in the respective binary state by an average value of a threshold voltage range associated with the respective binary state to generate calculated state weights; and
- adding up the calculated state weights of all the binary states.

33. The method of claim 30, wherein the calculated value includes a number of bad bits in the memory elements of the group, wherein the number of bad bits is compared to an expected number of bad bits and based on the comparison, a wear indication of the memory elements of the group is determined.

34. The method of claim 33, wherein the bad bits are detected by an error correcting code unit.

* * * * *

UNITED STATES PATENT AND TRADEMARK OFFICE
CERTIFICATE OF CORRECTION

| | |
|---|---|
| PATENT NO. | : 7,944,744 B2 |
| APPLICATION NO. | : 12/495404 |
| DATED | : May 17, 2011 |
| INVENTOR(S) | : Donald Ray Bryant-Rich |

Page 1 of 1

It is certified that error appears in the above-identified patent and that said Letters Patent is hereby corrected as shown below:

In the Claims:

Column 33, Claim 2, Line 6, "The method as in of claim 1, wherein the discharge-determining" should read --The method of claim 1, wherein the discharge-determining--.

Signed and Sealed this
Fourteenth Day of May, 2013

Teresa Stanek Rea
*Acting Director of the United States Patent and Trademark Office*